(12) United States Patent  
Nagata et al.

(10) Patent No.: US 10,814,497 B2  
(45) Date of Patent: Oct. 27, 2020

(54) ROBOT HAND APPARATUS, ROBOT HAND SYSTEM, AND HOLDING METHOD

(71) Applicant: Panasonic Intellectual Property Management Co., Ltd., Osaka (JP)

(72) Inventors: Takayuki Nagata, Osaka (JP); Yasunao Okazaki, Shiga (JP); Katsuhiko Asai, Nara (JP); Kazuo Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 230 days.

(21) Appl. No.: 16/038,208

(22) Filed: Jul. 18, 2018

(65) Prior Publication Data

US 2019/0030729 A1  Jan. 31, 2019

(30) Foreign Application Priority Data

Jul. 28, 2017  (JP) ................................. 2017-146235

(51) Int. Cl.
| | |
|---|---|
| *B25J 15/06* | (2006.01) |
| *B25J 15/02* | (2006.01) |
| *B25J 15/00* | (2006.01) |
| *B25J 15/12* | (2006.01) |
| *H01L 41/06* | (2006.01) |
| *H01L 41/12* | (2006.01) |
| *H01F 1/44* | (2006.01) |

(52) U.S. Cl.
CPC ....... *B25J 15/0616* (2013.01); *B25J 15/0028* (2013.01); *B25J 15/0246* (2013.01); *B25J 15/12* (2013.01); *H01F 1/447* (2013.01); *H01L 41/06* (2013.01); *H01L 41/12* (2013.01)

(58) Field of Classification Search
CPC . B25J 15/0246; B25J 15/0616; B25J 15/0028
See application file for complete search history.

(56) References Cited

U.S. PATENT DOCUMENTS

| | | | |
|---|---|---|---|
| 2011/0089708 A1* | 4/2011 | Mankame | .............. B25J 9/1095 294/86.4 |
| 2016/0284457 A1* | 9/2016 | Wilson | ..................... B25J 15/00 |

FOREIGN PATENT DOCUMENTS

| | | |
|---|---|---|
| JP | 2001-267271 | 9/2001 |
| JP | 2013-240870 | 12/2013 |
| JP | 2013240870 A * | 12/2013 |

* cited by examiner

*Primary Examiner* — Gerald McClain  
(74) *Attorney, Agent, or Firm* — Wenderoth, Lind & Ponack, L.L.P.

(57) ABSTRACT

A robot hand apparatus includes a holder having a bendable sucking surface that sucks an object; a magnetic elastic body arranged at the holder and formed of an elastic material containing magnetic particles; and a magnetic-field generator that is arranged at the holder and applies a magnetic field to the magnetic elastic body to change a coefficient of elasticity of the magnetic elastic body. When the magnetic-field generator applies a magnetic field to the magnetic elastic body, a flexible portion and a hardened portion having a bigger coefficient of elasticity than that of the flexible portion are formed in the magnetic elastic body. When the holder holds the object, in a state in which the sucking surface is bent at a position corresponding to the flexible portion, a region of the sucking surface between the position and a distal end of the holder sucks the object.

11 Claims, 14 Drawing Sheets

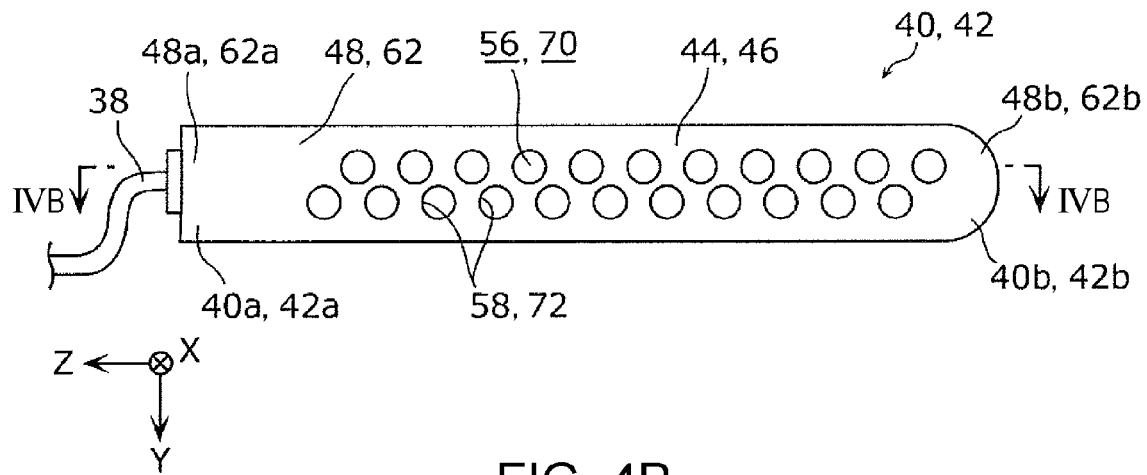
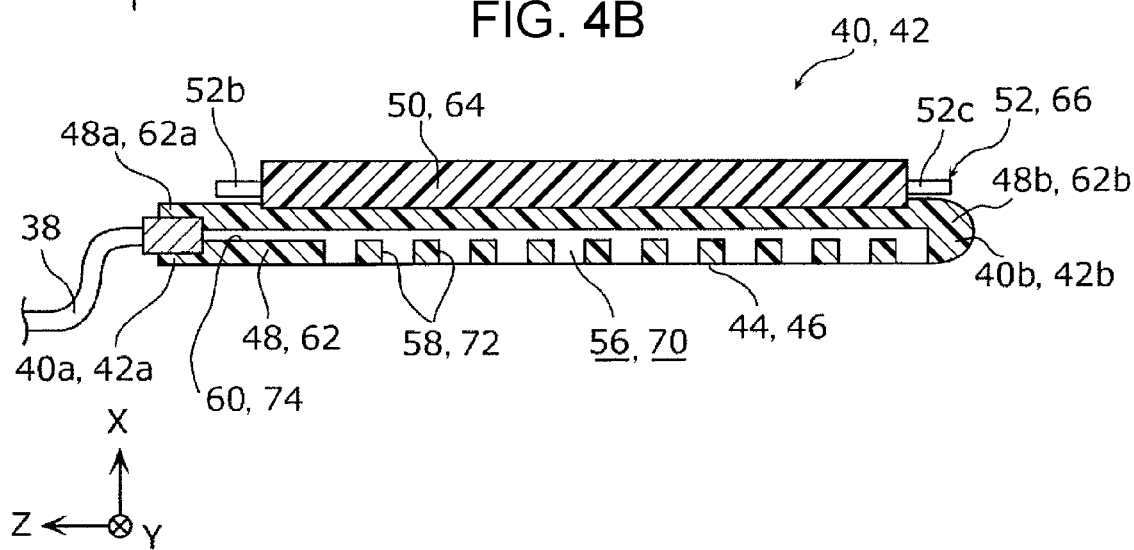
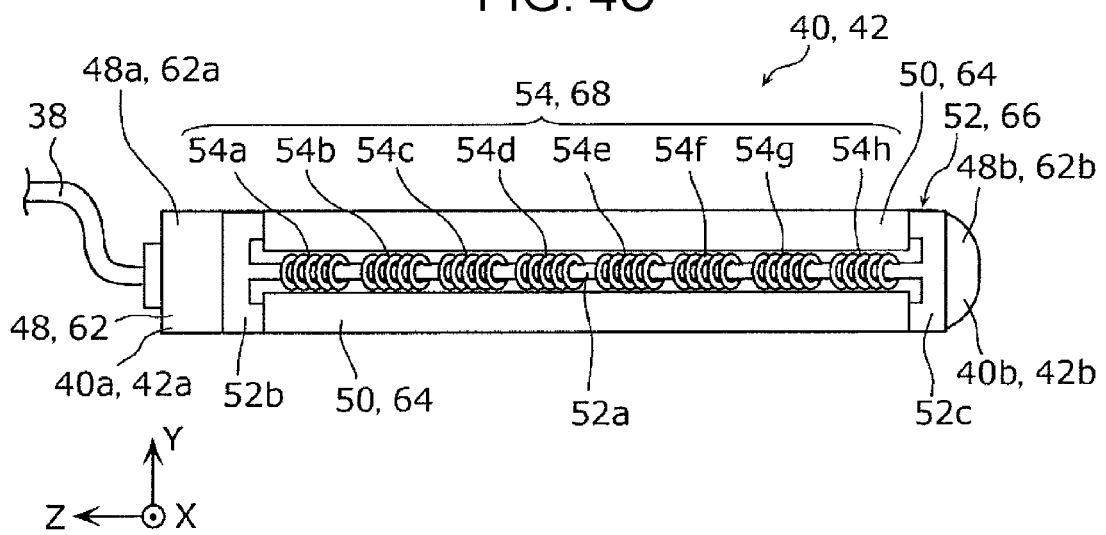

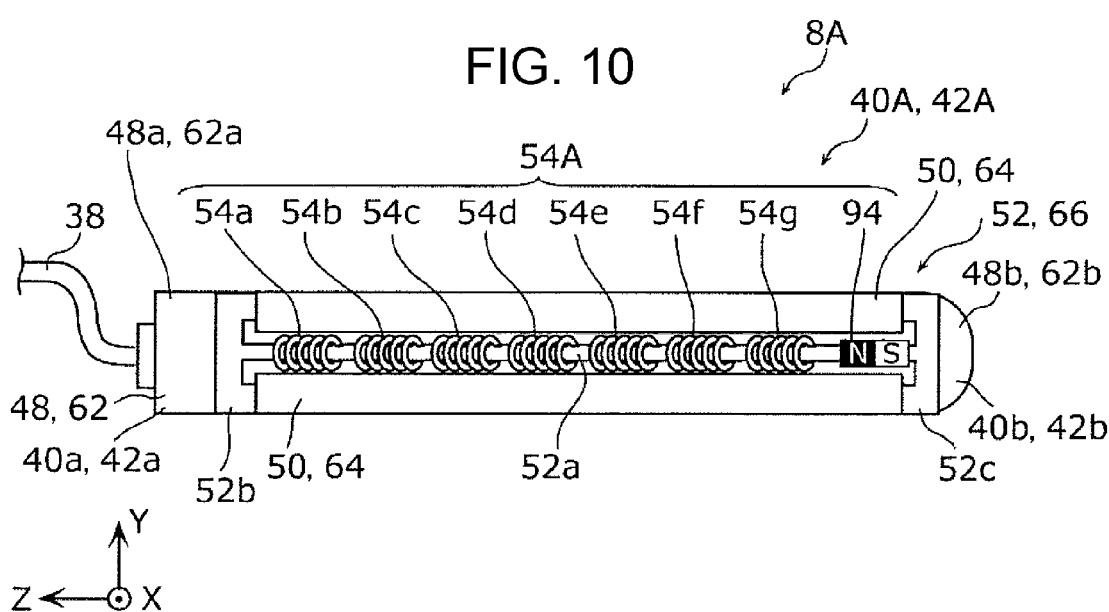
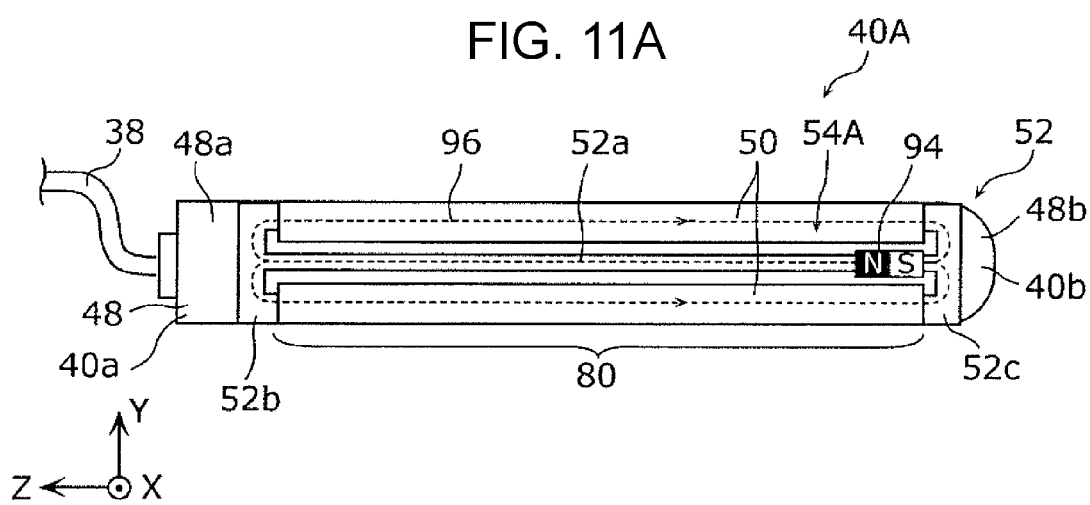
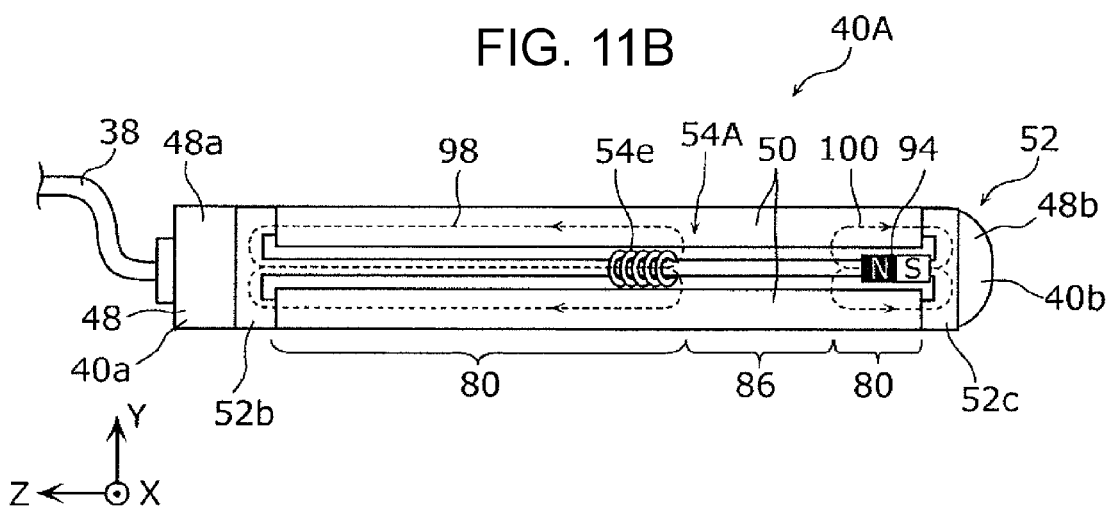

ROBOT HAND APPARATUS, ROBOT HAND SYSTEM, AND HOLDING METHOD

BACKGROUND

1. Technical Field

The present disclosure relates to a robot hand apparatus, a robot hand system, and a holding method.

2. Description of the Related Art

A robot hand apparatus of a type that sucks an object using negative pressure is known as one of robot hand apparatuses that hold objects (see, for example, Japanese Unexamined Patent Application Publication No. 2001-267271 and No. 2013-240870). The robot hand apparatus of this type includes a suction hand having a sucking surface formed with sucking holes. The sucking surface of the suction hand can suck an object using negative pressure by sucking air through the sucking holes in a state in which the sucking surface of the suction hand touches a surface that can be sucked of the object (hereinafter, referred to as "sucked surface").

SUMMARY

In some cases there is a need to pick up a specific product as an object with a robot hand apparatus from among products which are densely arranged in, for example, a warehouse of a store, without picking up a product other than the specific product. If the sucked surface of the object is smaller than the sucking surface of the suction hand, the target object and another product adjacent to the object are sucked together to the sucking surface of the suction hand. Thus, the target object and a product other than the specific product may be possibly picked up.

One non-limiting and exemplary embodiment provides a robot hand apparatus, a robot hand system, and a method of holding an object each capable of correctly picking up a target object.

In one general aspect, the techniques disclosed here feature a robot hand apparatus including a supporter; a holder with a proximal end thereof supported by the supporter, the holder having a sucking surface that is bendable at any position and that sucks an object using negative pressure; a magnetic elastic body arranged at the holder and formed of an elastic material containing magnetic particles; and a magnetic-field generator that is arranged at the holder and that applies a magnetic field to the magnetic elastic body to change a coefficient of elasticity of the magnetic elastic body, in which, when the magnetic-field generator applies a magnetic field to the magnetic elastic body, a flexible portion and a hardened portion having a bigger coefficient of elasticity than a coefficient of elasticity of the flexible portion are formed in the magnetic elastic body, and in which, when the holder holds the object, in a state in which the sucking surface is bent at a position corresponding to the flexible portion, a region of the sucking surface between the position and a distal end of the holder sucks the object.

It should be noted that the general or specific aspects of the present disclosure may be implemented as a system, a method, an integrated circuit, a computer program, a computer-readable storage medium, or any selective combination thereof. The computer-readable storage medium may include a non-volatile storage medium, for example, a compact disc-read only memory (CD-ROM).

With the robot hand apparatus according to one aspect of the present disclosure, a target object can be correctly picked up. Additional benefits and advantages according to one aspect of the present disclosure will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4A illustrates a first sucking surface of a first holder (a second sucking surface of a second holder) of the robot hand apparatus according to the first embodiment;

FIG. 4B is a cross-sectional view of the first holder (second holder) of the robot hand apparatus according to the first embodiment taken along line IVB-IVB of FIG. 4A;

FIG. 4C illustrates a first magnetic-field generator of the first holder (a second magnetic-field generator of the second holder) of the robot hand apparatus according to the first embodiment;

FIG. 10 illustrates a first holder (second holder) of the robot hand apparatus according to the second embodiment;

FIG. 11A illustrates a first holder according to a second embodiment in a state in which the first holder is entirely hardened;

FIG. 11B illustrates the first holder according to the second embodiment in a state in which the first holder is partly hardened;

DETAILED DESCRIPTION

Figure 1:
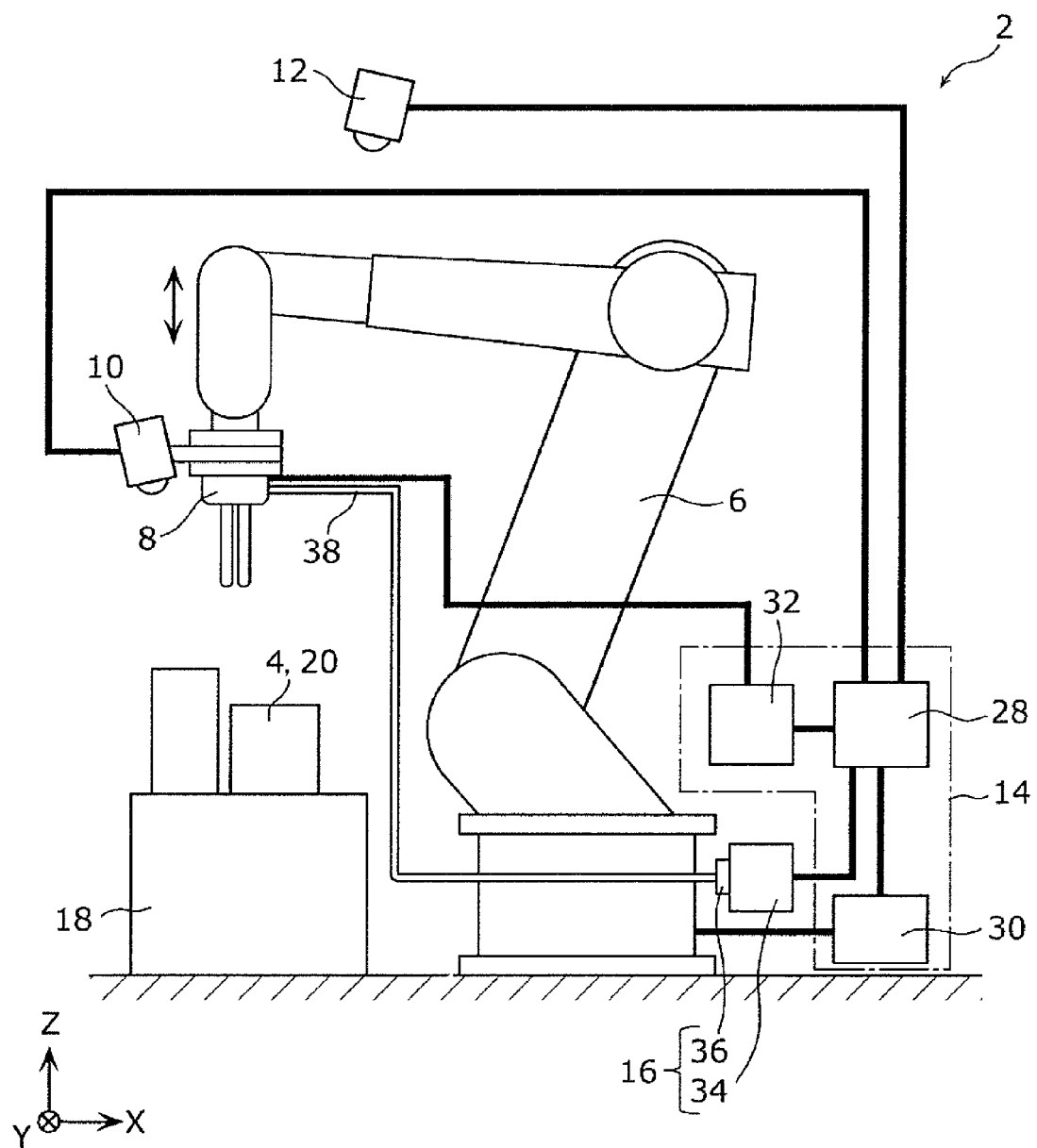
FIG. 1 illustrates a configuration of a robot hand system according to a first embodiment.

According to an aspect of the present disclosure, a robot hand apparatus includes a supporter; a holder with a proximal end thereof supported by the supporter, the holder having a sucking surface that is bendable at any position and that sucks an object using negative pressure; a magnetic elastic body arranged at the holder and formed of an elastic material containing magnetic particles; and a magnetic-field generator that is arranged at the holder and that applies a magnetic field to the magnetic elastic body to change a coefficient of elasticity of the magnetic elastic body, in which, when the magnetic-field generator applies the magnetic field to the magnetic elastic body, a flexible portion and a hardened portion having a bigger coefficient of elasticity than a coefficient of elasticity of the flexible portion are formed in the magnetic elastic body; and in which, when the holder holds the object, in a state in which the sucking surface is bent at a position corresponding to the flexible portion, a region of the sucking surface between the position and a distal end of the holder sucks the object.

With this aspect, by adjusting the position at which the sucking surface is bent on the basis of the position of the flexible portion in the magnetic elastic body, the size of the region of the sucking surface that sucks the object can be adjusted. Thus, the distal end of the holder can be prevented from protruding from an end of the object, and, for example, a target object can be correctly picked up from among densely arranged products. Furthermore, by forming the flexible portion in the magnetic elastic body, the sucking surface can be easily bent at the position corresponding to the flexible portion.

For example, the distal end of the holder may be pressed to the object, and thus the sucking surface may be bent at the position.

With this aspect, by using the force of pressing the distal end of the holder to the object, the sucking surface can be bent at the position corresponding to the flexible portion. Thus, a driving device such as an actuator that bends the first sucking surface is not required to be mounted on the robot hand apparatus, and the robot hand apparatus can be downsized.

For example, the holder may extend long from the proximal end to the distal end; and the magnetic-field generator may be coils that are lined in a longitudinal direction of the holder, that are individually energized, and thus that individually apply magnetic fields to the magnetic elastic body.

With this aspect, by energizing the at least one of the coils, a magnetic field can be easily applied to the magnetic elastic body.

For example, when two specific coils of the coils are energized, the two specific coils may generate magnetic fields in which same magnetic poles oppose each other; and the flexible portion may be formed in the magnetic elastic body between the two specific coils.

With this aspect, by energizing the two specific coils of the coils, the flexible portion can be formed in the magnetic elastic body between the two specific coils.

For example, the magnetic-field generator may further have a permanent magnet that applies a magnetic field to the magnetic elastic body; the permanent magnet may be arranged to oppose the coils in the longitudinal direction of the holder; when a specific coil of the coils is energized, the specific coil and the permanent magnet may generate magnetic fields in which same magnetic poles oppose each other; and the flexible portion may be formed in the magnetic elastic body between the specific coil and the permanent magnet.

With this aspect, by energizing the specific coil of the coils, the flexible portion can be formed in the magnetic elastic body between the specific coil and the permanent magnet.

For example, the sucking surface may have a sucking hole through which air is sucked; and when air is sucked through the sucking hole, the sucking surface may suck the object using negative pressure.

With the aspect, the holder can hold the object with the simple configuration.

For example, the holder may include a pair of holders; and the pair of holders may be arranged such that sucking surfaces of the pair of holders oppose each other.

With the aspect, the object can be further stably held by the pair of holders.

According to another aspect of the present disclosure, a robot hand system includes any one of the aforementioned robot hand apparatuses; a robot arm apparatus that supports the robot hand apparatus and that changes a position or a posture of the robot hand apparatus; a pressure regulating device that sucks air from the holder of the robot hand apparatus; and a controller that controls the robot hand apparatus, the robot arm apparatus, and the pressure regulating device so that the robot hand apparatus holds the object.

With this aspect, by adjusting the position at which the sucking surface is bent on the basis of the position of the flexible portion in the magnetic elastic body, the size of the region of the sucking surface that sucks the object can be adjusted. Thus, the distal end of the holder can be prevented from protruding from an end of the object, and, for example, a target object can be correctly picked up from among densely arranged products. Furthermore, by forming the flexible portion in the magnetic elastic body, the sucking surface can be easily bent at the position corresponding to the flexible portion.

For example, the robot hand system may further include an imaging device that image captures the object, in which the controller may judge a sucked region that can be sucked of a sucked surface of the object on the basis of a result of the image capture by the imaging device, and determine a position of the flexible portion to be formed in the magnetic elastic body, and thus, in a state in which the sucking surface is bent at a position corresponding to the flexible portion, a region of the sucking surface between the position and the distal end of the holder may suck the object so as not to protrude from the sucked region.

With the aspect, by determining the bent position of the first sucking surface and the sucking position of the first holder in accordance with the judged sucked region, the object can be further reliably held.

According to yet another aspect of the present disclosure, a holding method using a robot hand apparatus is provided. The robot hand apparatus includes a supporter, a holder with a proximal end thereof supported by the supporter, the holder having a sucking surface that is bendable at any position and that sucks an object using negative pressure, a magnetic elastic body arranged at the holder and formed of an elastic material containing magnetic particles, and a magnetic-field generator that is arranged at the holder and that applies a magnetic field to the magnetic elastic body to change a coefficient of elasticity of the magnetic elastic body. The method includes applying a magnetic field to the magnetic elastic body, and thus forming a flexible portion and a hardened portion having a bigger coefficient of elasticity than a coefficient of elasticity of the flexible portion in the magnetic elastic body; pressing a distal end of the holder to the object, and thus bending the sucking surface at a position corresponding to the flexible portion; and causing a region of the sucking surface between the position and the distal end of the holder to suck the object.

With this aspect, by adjusting the position at which the sucking surface is bent on the basis of the position of the flexible portion in the magnetic elastic body, the size of the region of the sucking surface that sucks the object can be adjusted. Thus, the distal end of the holder can be prevented from protruding from the end of the object, and, for example, a target object can be correctly picked up from among densely arranged products. Furthermore, by forming the flexible portion in the magnetic elastic body, the sucking surface can be easily bent at the position corresponding to the flexible portion.

For example, the holding method may further include image capturing the object using an imaging device; judging a sucked region that is included in a sucked surface of the object and that can be sucked to the sucking surface of the holder on the basis of a result of the image capture by the imaging device; and determining a position of the flexible portion to be formed in the magnetic elastic body on the basis of a size of the sucked region.

With this aspect, the position of the flexible portion to be formed in the magnetic elastic body is determined on the basis of the size of the sucked region of the object. Thus, when the sucking surface sucks the sucked region of the object in the state in which the sucking surface is bent at the position corresponding to the flexible portion, the distal end of the holder can be effectively prevented from protruding from the sucked region of the object.

It should be noted that the general or specific aspects may be implemented as a system, a method, an integrated circuit, a computer program, a computer-readable storage medium such as a CD-ROM, or any selective combination thereof.

Embodiments are specifically described below with reference to the drawings.

The embodiments to be described below each represent a general or specific example. The numerals, shapes, materials, components, arrangement positions and connection forms of the components, steps, the order of the steps described in the embodiments are merely examples and do not intend to limit the present disclosure. Among the components in the following embodiments, a component not described in the independent claim indicating the most general concept is described as an optional component.

First Embodiment 1-1. Configuration of Robot Hand System

Figure 2A:
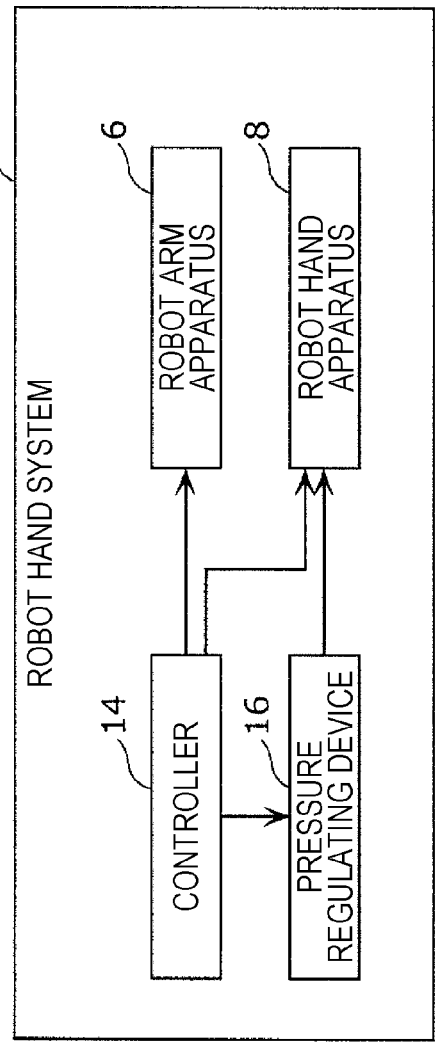
FIG. 2A is a block diagram illustrating a major functional configuration of the robot hand system according to the first embodiment.
Figure 2B:
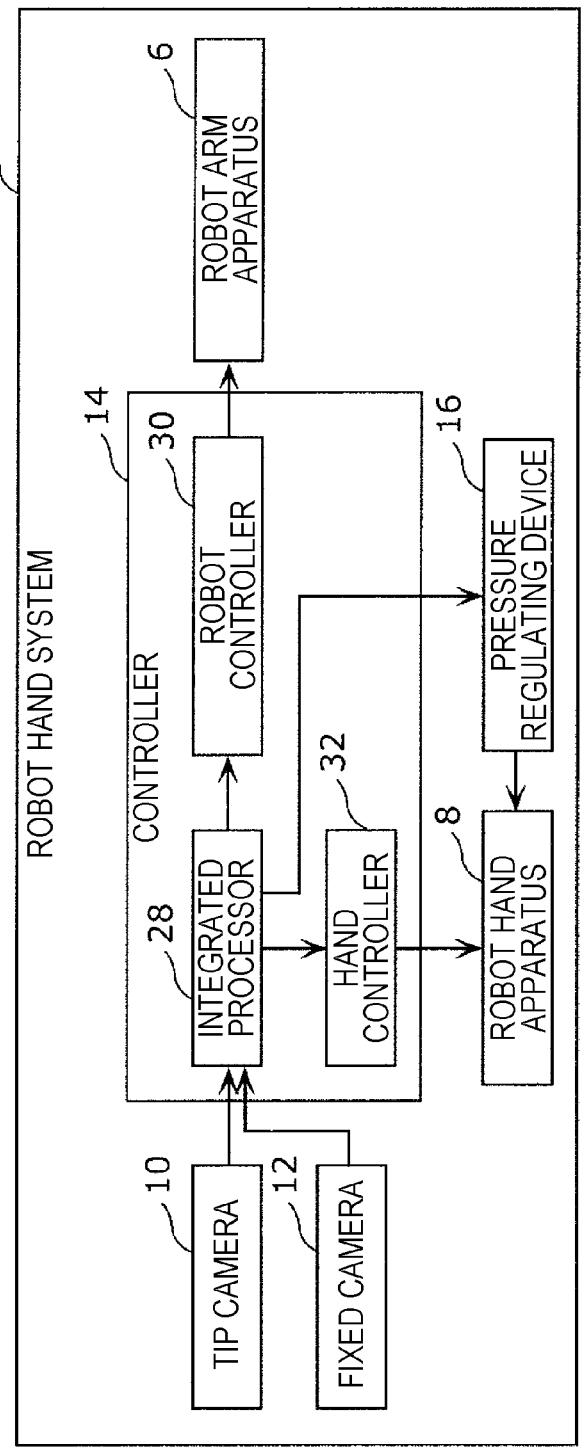
FIG. 2B is a block diagram illustrating a specific functional configuration of the robot hand system according to the first embodiment.
Figure 3:
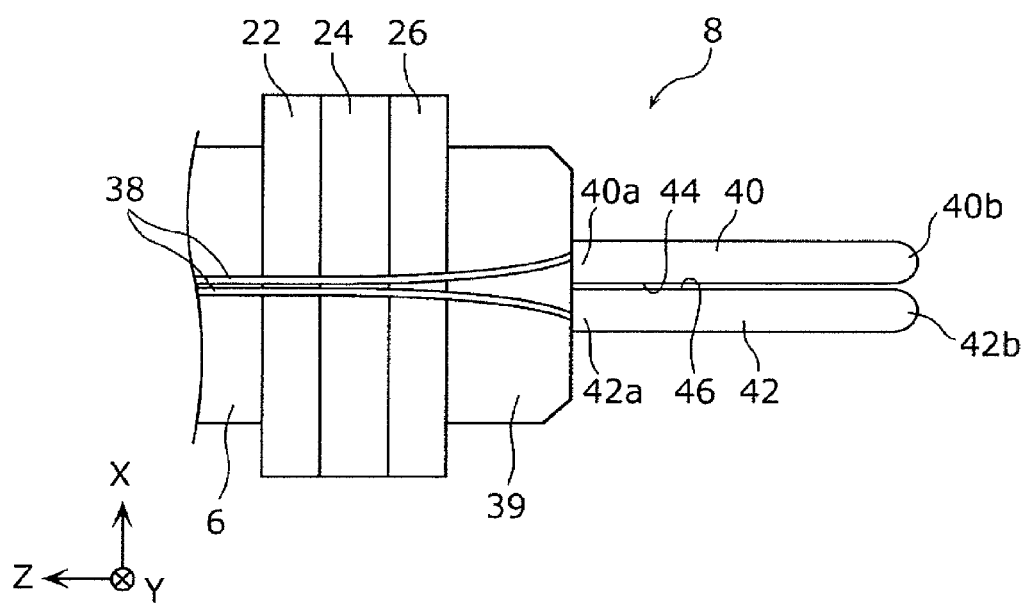
FIG. 3 illustrates a robot hand apparatus in an enlarged manner according to the first embodiment.

A configuration of a robot hand system 2 according to a first embodiment is described first with reference to FIGS. 1 to 3. FIG. 1 illustrates the configuration of the robot hand system 2 according to the first embodiment. FIG. 2A is a block diagram illustrating a major functional configuration of the robot hand system 2 according to the first embodiment. FIG. 2B is a block diagram illustrating a specific functional configuration of the robot hand system 2 according to the first embodiment. FIG. 3 illustrates a robot hand apparatus 8 in an enlarged manner according to the first embodiment.

The robot hand system 2 according to the first embodiment is a system that picks up and conveying an object 4. As illustrated in FIGS. 1, 2A, and 2B, the robot hand system 2 includes a robot arm apparatus 6, the robot hand apparatus 8, a tip camera 10 (an example of imaging device), a fixed camera 12, a controller 14, and a pressure regulating device 16.

The object 4 is a product such as a package box having any of various shapes and sizes. As illustrated in FIG. 1, products 20 are adjacently (densely) arranged on a palette 18 placed on a floor surface of, for example, a warehouse of a store. The object 4 is a product 20 which is a target to be picked up by the robot hand system 2 from among the products 20.

The robot arm apparatus 6 is formed of, for example, an articulated coordinate robot. The robot arm apparatus 6 changes the position or posture of the robot hand apparatus 8 with six degrees of freedom in a predetermined working area. As illustrated in FIG. 3, a hand mount 22 and a camera mount 24 are arranged at a distal end of the robot arm apparatus 6. Note that the robot arm apparatus 6 is not limited to the articulated coordinate robot, and may be formed of another type of robot.

As illustrated in FIGS. 1 and 3, the robot hand apparatus 8 is mounted to the distal end (the hand mount 22 and the camera mount 24) of the robot arm apparatus 6 via a mounting flange 26. The robot hand apparatus 8 sucks, for example, one product 20 as the object 4 using negative pressure from among the products 20. Thus, the robot hand apparatus 8 can hold the target object 4 from among the products 20. The configuration of the robot hand apparatus 8 is described later in detail.

As illustrated in FIGS. 1 and 3, the tip camera 10 is mounted to the camera mount 24 of the robot arm apparatus 6. The tip camera 10 image captures the object 4 existing in front of the robot hand apparatus 8. Note that FIG. 3 does not illustrate the tip camera 10 for the convenience of the description.

The fixed camera 12 is fixed to, for example, a ceiling of a room where the robot hand system 2 is installed. The fixed camera 12 image captures the robot hand apparatus 8, the object 4 existing in front of the robot hand apparatus 8, and a conveyance destination (for example, storage shelf) of the object 4.

As illustrated in FIGS. 1 and 2B, the controller 14 has an integrated processor 28, a robot controller 30, and a hand controller 32. The integrated processor 28 a) transmits an operation command signal to the robot controller 30, b) transmits an energization control signal to the hand controller 32, and c) transmits a pressure control signal to the pressure regulating device 16 on the basis of image information from the tip camera 10 and the fixed camera 12 and sensor information from various sensors (not illustrated). The robot controller 30 controls the operation of the robot arm apparatus 6 on the basis of the operation command signal from the integrated processor 28. The hand controller 32 controls the energization of a first magnetic-field generator 54 and a second magnetic-field generator 68 (described later) of the robot hand apparatus 8 independently from each other on the basis of the energization control signal from the integrated processor 28.

The pressure regulating device 16 has a vacuum pump 34 and a valve 36. As illustrated in FIGS. 1 and 3, the vacuum pump 34 communicates with a first space 56 (see FIG. 4B described later) of a first holder 40 and a second space 70 (see FIG. 4B described later) of a second holder 42 of the robot hand apparatus 8 via a pair of tubes 38. The vacuum pump 34 sucks air from the first space 56 of the first holder 40 and the second space 70 of the second holder 42 individually via the tubes 38 on the basis of the pressure control signal from the integrated processor 28. The valve 36 is an on-off valve that opens the first space 56 of the first holder 40 and the second space 70 of the second holder 42 individually to the atmosphere, and is arranged at, for example, the vacuum pump 34. The valve 36 is opened and closed on the basis of the pressure control signal from the integrated processor 28. When the valve 36 is closed and the vacuum pump 34 sucks air, for example, in a state in which the object 4 is in close contact with a first sucking surface 44 of the first holder 40 or a second sucking surface 46 of the second holder 42 (refer to FIG. 4B described later), the pressures of the first space 56 of the first holder 40 and the second space 70 of the second holder 42 are individually reduced to be lower than the atmospheric pressure, and vacuum sucks the object 4 in close contact. Then, when the valve 36 is opened, the pressures of the first space 56 of the first holder 40 and the second space 70 of the second holder 42 are individually restored to the atmospheric pressure, and the vacuum suction of the object 4 is released.

1-2. Configuration of Robot Hand Apparatus

Figure 5A:
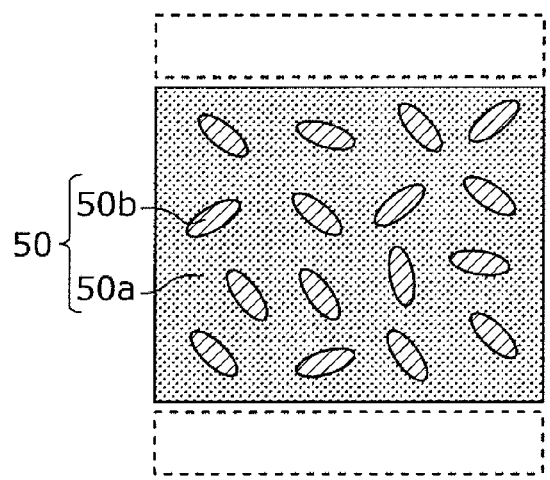
FIG. 5A schematically illustrates a first magnetic elastic body according to the first embodiment in a state before a magnetic field is applied.
Figure 5B:
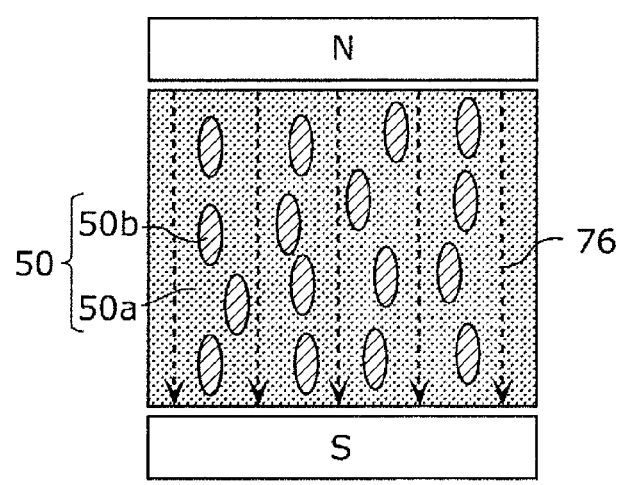
FIG. 5B schematically illustrates the first magnetic elastic body according to the first embodiment in a state in which a magnetic field is applied.
Figure 6A:
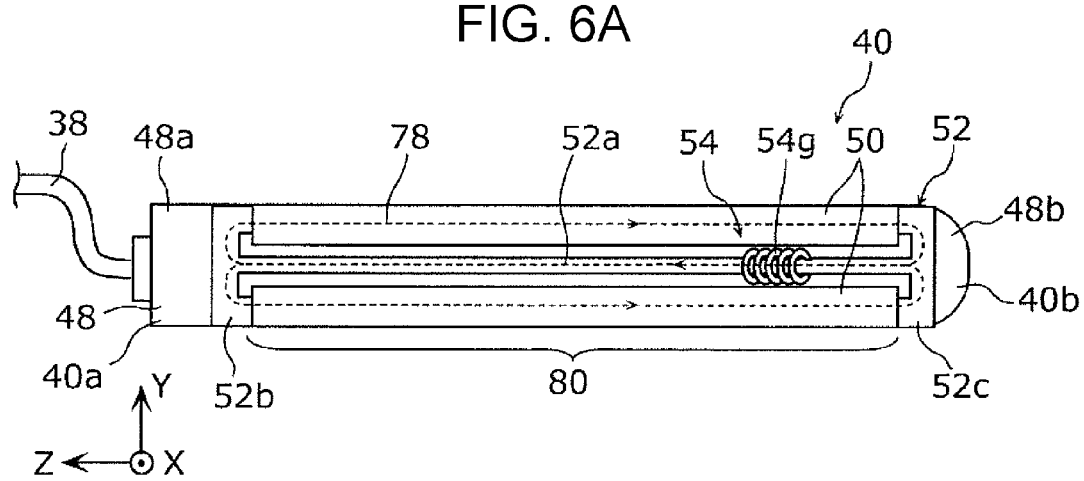
FIG. 6A illustrates the first holder according to the first embodiment in a state in which the first holder is entirely hardened.
Figure 6B:
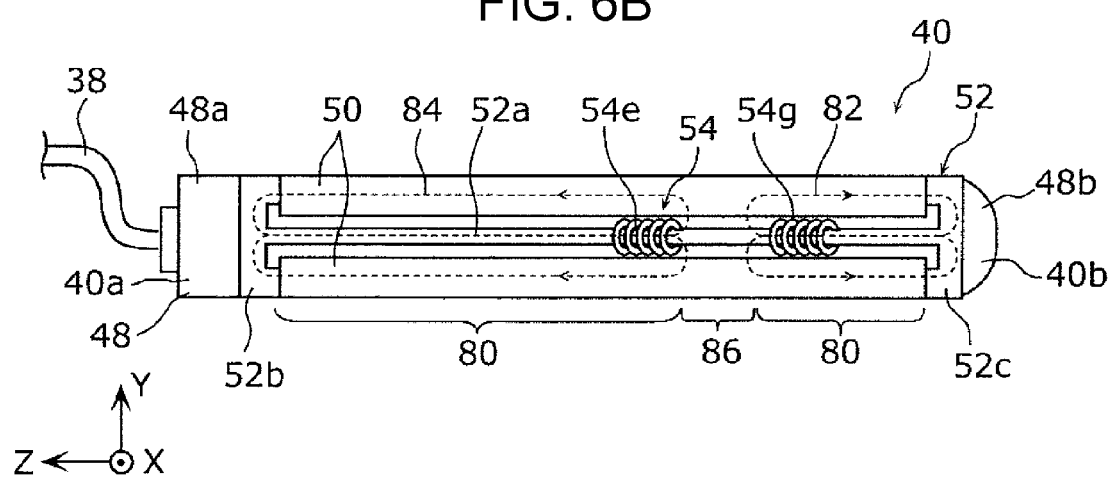
FIG. 6B illustrates the first holder according to the first embodiment in a state in which the first holder is partly hardened.

A configuration of the robot hand apparatus 8 according to the first embodiment is described next with reference to FIGS. 3 to 6B. FIG. 4A illustrates the first sucking surface 44 of the first holder 40 (the second sucking surface 46 of the second holder 42) of the robot hand apparatus 8 according to the first embodiment. FIG. 4B is a cross-sectional view of the first holder 40 (second holder 42) of the robot hand apparatus 8 according to the first embodiment taken along line IVB-IVB of FIG. 4A. FIG. 4C illustrates the first magnetic-field generator 54 of the first holder 40 (the second magnetic-field generator 68 of the second holder 42) of the robot hand apparatus 8 according to the first embodiment. FIG. 5A schematically illustrates a first magnetic elastic body 50 according to the first embodiment in a state before a magnetic field is applied. FIG. 5B schematically illustrates the first magnetic elastic body 50 according to the first embodiment in a state in which a magnetic field is applied. FIG. 6A illustrates the first holder 40 according to the first embodiment in a state in which the first holder 40 is entirely hardened. FIG. 6B illustrates the first holder 40 according to the first embodiment in a state in which the first holder 40 is partly hardened.

As illustrated in FIG. 3, the robot hand apparatus 8 includes a hand supporter 39 (an example of supporter), the first holder 40, and the second holder 42.

The hand supporter 39 is a member that supports the first holder 40 and the second holder 42. The hand supporter 39 is mounted to the distal end (the hand mount 22 and the camera mount 24) of the robot arm apparatus 6 via the mounting flange 26.

The first holder 40 and the second holder 42 each are a flexible finger that sucks the object 4 using negative pressure. The first holder 40 extends long from a proximal end 40a to a distal end 40b. Similarly, the second holder 42 extends long from a proximal end 42a to a distal end 42b. The proximal end 40a of the first holder 40 and the proximal end 42a of the second holder 42 are supported by the hand supporter 39.

As illustrated in FIG. 3, the first holder 40 and the second holder 42 respectively have the first sucking surface 44 and the second sucking surface 46 that suck the object 4 using negative pressure. The first holder 40 and the second holder 42 are arranged such that the first sucking surface 44 opposes the second sucking surface 46. As illustrated in FIGS. 4A and 4B, the first sucking surface 44 has first sucking holes 58, and the second sucking surface 46 has second sucking holes 72. In a state in which both the first sucking surface 44 and the second sucking surface 46 are not bent, the first sucking surface 44 and the second sucking surface 46 may be in contact with each other, or a gap of, for example, about several millimeters may be formed between the first sucking surface 44 and the second sucking surface 46.

As illustrated in FIGS. 4A to 4C, the first holder 40 has a first elastic member 48, a pair of first magnetic elastic bodies 50, a first yoke 52, and a first magnetic-field generator 54.

The first elastic member 48 is formed of an elastic soft resin, for example, an elastomer such as silicone rubber. The first elastic member 48 is a member serving as a base of the first holder 40. The first elastic member 48 extends long from a proximal end 48a to a distal end 48b. The first space 56 which extends in the longitudinal direction (Z-axis direction) of the first elastic member 48 is formed in the first elastic member 48.

As illustrated in FIGS. 4A and 4B, the first sucking surface 44 is formed at a side surface of the first elastic member 48. The first sucking surface 44 is bendable in a mountain fold manner at any position in the longitudinal direction of the first elastic member 48. The first sucking surface 44 has the first sucking holes 58 which are circular in plan view and through which the first space 56 communicates with the outside. The first sucking holes 58 are arranged in a staggered manner in the longitudinal direction of the first elastic member 48.

The proximal end 48a of the first elastic member 48 is supported by the hand supporter 39. As illustrated in FIG. 4B, a connection hole 60 through which the first space 56 communicates with the outside is formed at the proximal end 48a of the first elastic member 48. An end of corresponding one of the tubes 38 is connected to the connection hole 60.

As illustrated in FIGS. 4B and 4C, the pair of first magnetic elastic bodies 50 are arranged to be in contact with a side surface of the first elastic member 48 on the side opposite to the first sucking surface 44. Specifically, the pair of first magnetic elastic bodies 50 extend long in the longitudinal direction of the first elastic member 48, and are arranged on both ends in the short side direction (Y-axis direction) of the first elastic member 48.

The pair of first magnetic elastic bodies 50 each are formed of an elastic material in which magnetic particles are dispersed. The elastic material is formed of a soft resin, for example, an elastomer such as silicone rubber, or a gel material. The magnetic particles are powder of a ferromagnetic material or a high magnetic permeability material formed of, for example, iron, carbonyl iron, ferrite, or the like. The pair of magnetic elastic bodies 50 thus formed each have a property that the coefficient of elasticity thereof is changed when a magnetic field (magnetic flux) is applied. The principle that the coefficient of elasticity of the first magnetic elastic body 50 is changed will be described later.

The first yoke 52 is arranged to oppose the side surface of the first elastic member 48 on the side opposite to the first sucking surface 44. The first yoke 52 is formed of a soft magnetic material of, for example, pure iron or low-carbon steel, and has a thin-plate shape. The first yoke 52 has a long iron core 52a, and a pair of connection portions 52b and 52c formed on both ends in the longitudinal direction (Z-axis direction) of the iron core 52a and each have a substantially E-like shape. The iron core 52a is arranged between the pair of first magnetic elastic bodies 50, and extends in the longitudinal direction of the first elastic member 48. The iron core 52a is bendable in the longitudinal direction of the first elastic member 48. The pair of connection portions 52b and 52c are connected to both ends in the longitudinal direction (Z-axis direction) of the pair of first magnetic elastic bodies 50.

The first magnetic-field generator 54 has coils 54a, 54b, 54c, 54d, 54e, 54f, 54g, and 54h (54a to 54h) around the iron core 52a of the first yoke 52. The coils 54a to 54h are lined in that order in the longitudinal direction of the first elastic member 48. The coils 54a to 54h are individually energized by the hand controller 32. Thus, the coils 54a to 54h individually generate magnetic fields, and individually apply magnetic fields to the pair of first magnetic elastic bodies 50. In this case, the pair of first magnetic elastic bodies 50 and the first yoke 52 form a magnetic circuit.

The first holder 40 may further have a protection cover (not illustrated) that covers the pair of first magnetic elastic bodies 50, the first yoke 52, and the first magnetic-field generator 54. The protection cover may be flexible, and may be formed of a low magnetic permeability material that does not magnetically affect the magnetic circuit.

Moreover, as illustrated in FIGS. 4A to 4C, the second holder 42 has a second elastic member 62, a pair of second magnetic elastic bodies 64, a second yoke 66, and a second magnetic-field generator 68, similarly to the first holder 40.

The second elastic member 62 is configured similarly to the first elastic member 48. That is, the second elastic member 62 extends long from a proximal end 62a to a distal end 62b. As illustrated in FIG. 4B, the second space 70 which extends in the longitudinal direction (Z-axis direction) of the second elastic member 62 is formed in the second elastic member 62.

As illustrated in FIGS. 4A and 4B, the second sucking surface 46 is formed at a side surface of the second elastic member 62. The second sucking surface 46 is bendable in a mountain fold manner at any position in the longitudinal direction of the second elastic member 62. The second sucking surface 46 has the second sucking holes 72 which are circular in plan view and through which the second space 70 communicates with the outside.

The proximal end 62a of the second elastic member 62 is supported by the hand supporter 39. As illustrated in FIG. 4B, a connection hole 74 through which the second space 70 communicates with the outside is formed at the proximal end 62a of the second elastic member 62. Corresponding one of ends of the tubes 38 is connected to the connection hole 74.

The configurations of the pair of second magnetic elastic bodies 64, the second yoke 66, and the second magnetic-field generator 68 are the same as the configurations of the pair of first magnetic elastic bodies 50, the first yoke 52, and the first magnetic-field generator 54, and hence the redundant description thereof is omitted.

The principle that the coefficient of elasticity of the first magnetic elastic body 50 is changed is described now with reference to FIGS. 5A and 5B. As illustrated in FIG. 5A, the first magnetic elastic body 50 has an elastic material 50a and magnetic particles 50b dispersed in the elastic material 50a.

As illustrated in FIG. 5A, in a state in which a magnetic field is not applied to the first magnetic elastic body 50, the magnetic particles 50b are oriented in irregular directions. When a magnetic field is applied to the first magnetic elastic body 50 in this state, the magnetic particles 50b are magnetically polarized, and magnetic coupling is formed among the polarized magnetic particles 50b. As illustrated in FIG. 5B, the magnetic particles 50b are arrayed in a direction parallel to magnetic force lines 76, the magnetic coupling force formed among the magnetic particles 50b increases, and thus the first magnetic elastic body 50 has a strong structure. Consequently, the deformation resistance to a load increases and the coefficient of elasticity of the first magnetic elastic body 50 increases in the direction parallel to the magnetic force lines 76. Also, the deformation resistance to a load increases and the coefficient of elasticity of the first magnetic elastic body 50 increases in the direction orthogonal to the magnetic force lines 76.

That is, by applying a magnetic field to the first magnetic elastic body 50, the coefficient of elasticity of the first magnetic elastic body 50 can be changed. Moreover, the magnetic coupling force among the magnetic particles 50b is changed in accordance with the strength of the magnetic field to be applied. Owing to this, the coefficient of elasticity of the first magnetic elastic body 50 is changed in accordance with the strength of the magnetic field to be applied. The principle that the coefficient of elasticity of the second magnetic elastic body 64 is changed is similar to the above-described principle, and hence its description is omitted.

Operation of entirely or partly hardening the first holder 40 by changing the coefficient of elasticity of the first magnetic elastic body 50 is described with reference to FIGS. 6A and 6B. For the convenience of description, FIG. 6A illustrates the energized coil 54g among the coils 54a to 54h, and FIG. 6B illustrates the energized coils 54e and 54g among the coils 54a to 54h.

In the state illustrated in FIG. 6A, the coil 54g among the coils 54a to 54h is energized by the hand controller 32. Thus, the coil 54g among the coils 54a to 54h generates a magnetic field. The magnetic permeability of the first yoke 52 is 1000 to 10000 times the magnetic permeability of air. The magnetic field from the coil 54g almost does not leak to the atmosphere, and is concentrated on the first yoke 52. Also, the pair of magnetic elastic bodies 50 have high magnetic permeability because of the magnetic particles. The magnetic field from the coil 54g almost does not leak to the atmosphere, and is concentrated on the pair of first magnetic elastic bodies 50. Consequently, as shown by broken-line arrows in FIG. 6A, one magnetic circuit 78 is formed. In the magnetic circuit 78, the magnetic field from the coil 54g passes through the iron core 52a and the connection portion 52b of the first yoke 52, the pair of first magnetic elastic bodies 50, the connection portion 52c, and the iron core 52a in that order, and then returns to the coil 54g. Thus, the magnetic field from the coil 54g is applied to the pair of magnetic elastic bodies 50.

As illustrated in FIG. 6A, the magnetic field from the coil 54g passes through each of the pair of first magnetic elastic bodies 50 from one end to the other end in the longitudinal direction thereof, and the coefficient of elasticity of each of the pair of magnetic elastic bodies 50 entirely increases. Consequently, a hardened portion 80 is formed in the entire region of each of the pair of magnetic elastic bodies 50, and the first holder 40 is entirely hardened.

In contrast, in the state illustrated in FIG. 6B, two specific coils, for example, the coils 54e and 54g among the coils 54a to 54h are energized by the hand controller 32. In this case, when electric current is applied to the coil 54e and the coil 54g in the opposite directions, magnetic fields in which the same magnetic poles (for example, N-poles) oppose each other is generated. The magnetic fields generated from the coil 54e and the coil 54g repel each other and leak to the atmosphere, immediately after generated. The magnetic fields leaking to the atmosphere is concentrated on each of the pair of first magnetic elastic bodies 50 with high magnetic permeability.

Consequently, as shown by broken-line arrows in FIG. 6B, two magnetic circuits 82 and 84 are formed. In the one magnetic circuit 82, the magnetic field from the coil 54e passes through the iron core 52a of the first yoke 52, the pair of first magnetic elastic bodies 50, the connection portion 52b, and the iron core 52a in that order, and then returns to the coil 54e. Thus, the magnetic field from the coil 54e is applied to the pair of magnetic elastic bodies 50 in the magnetic circuit 82. In the other magnetic circuit 84, the magnetic field from the coil 54g passes through the iron core 52a of the first yoke 52, the pair of first magnetic elastic bodies 50, the connection portion 52c, and the iron core 52a in that order, and then returns to the coil 54g. Thus, the magnetic field from the coil 54g is applied to the pair of magnetic elastic bodies 50 in the magnetic circuit 84.

As illustrated in FIG. 6B, the magnetic field from the coil 54e passes through a region of each of the pair of first magnetic elastic bodies 50 on the side near the proximal end 40a of the first holder 40 with respect to the coil 54e. In contrast, the magnetic field from the coil 54g passes through a region of each of the pair of first magnetic elastic bodies 50 on the side near the distal end 40b of the first holder 40 with respect to the coil 54g. Thus, the coefficient of elasticity in the region where the magnetic field passes of each of the pair of first magnetic elastic bodies 50 is relatively big, and the coefficient of elasticity in a region where the magnetic field does not pass (that is, a region between the coil 54e and the coil 54g) is relatively small. Consequently, in each of the pair of magnetic elastic bodies 50, a flexible portion 86 is formed in the region between the coil 54e and the coil 54g, and a hardened portion 80 with a bigger coefficient of elasticity than that of the flexible portion 86 is formed in the region other than the flexible portion 86. That is, the first holder 40 is partly hardened.

Hence, the first sucking surface 44 of the first holder 40 can be easily bent at a position corresponding to the flexible portion 86 in the longitudinal direction of the first holder 40. Note that the position of the flexible portion 86 can be appropriately changed by desirably selecting a combination of two specific coils to be energized from among the coils 54a to 54h. Operation of entirely or partly hardening the second holder 42 is similar to the above-described operation and hence its description is omitted.

1-3. Operation of Robot Hand System

Figure 7:
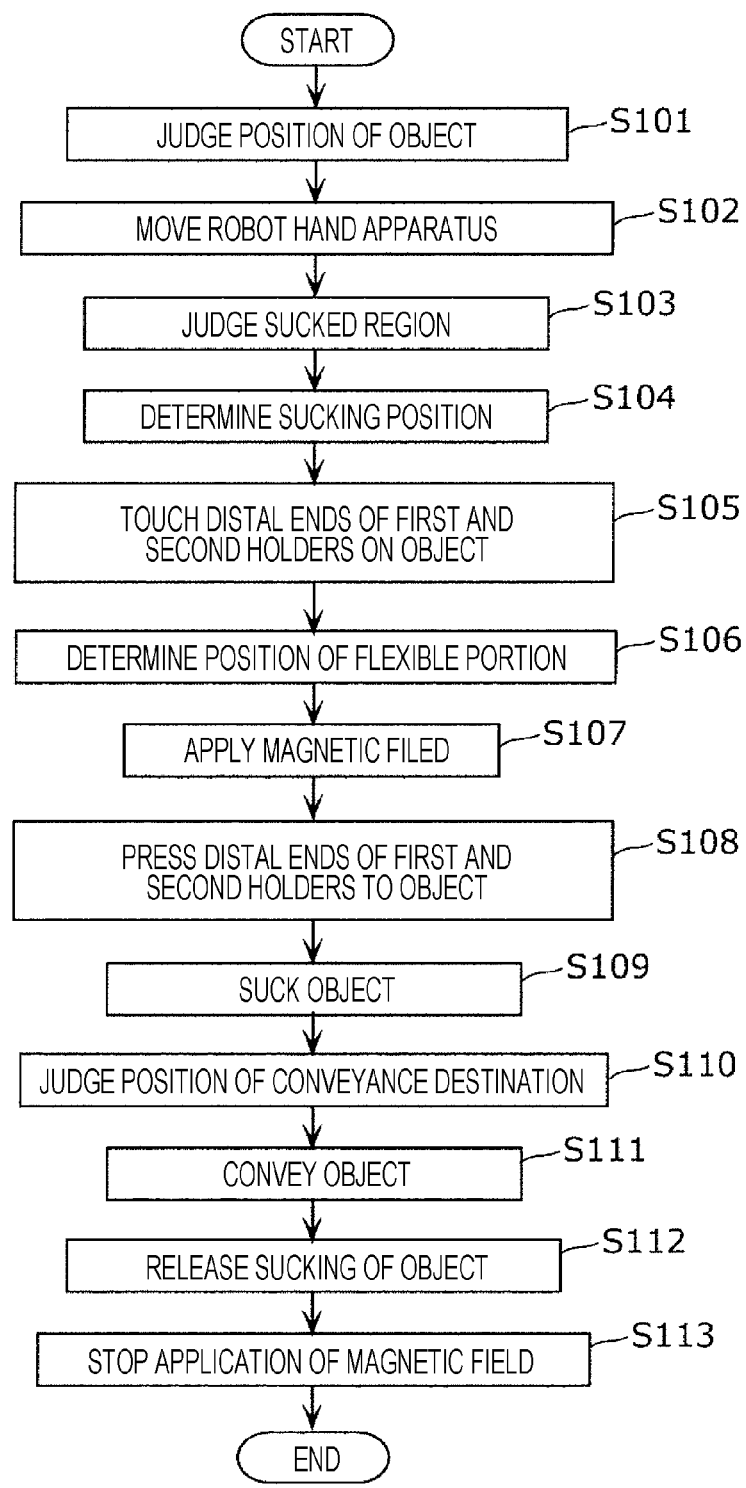
FIG. 7 is a flowchart showing a flow of operation of the robot hand system according to the first embodiment.
Figure 8:
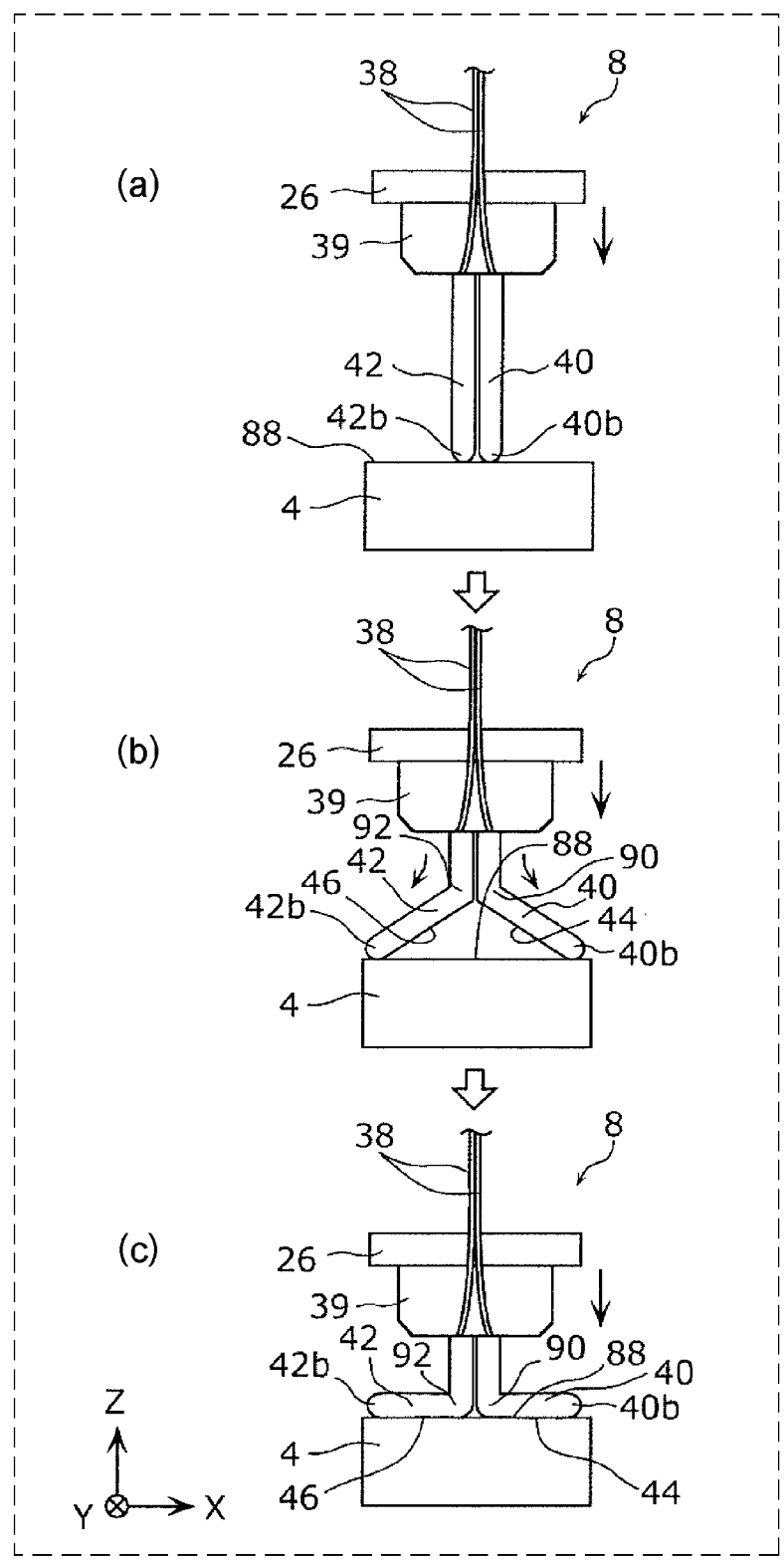
FIG. 8 illustrates the flow of the operation of the robot hand system according to the first embodiment.

Operation of the robot hand system 2 according to the first embodiment is described next with reference to FIGS. 7 and 8. FIG. 7 is a flowchart showing a flow of the operation of the robot hand system 2 according to the first embodiment. FIG. 8 illustrates the flow of the operation of the robot hand system 2 according to the first embodiment.

As illustrated in FIG. 7, the integrated processor 28 of the controller 14 judges the position of the object 4 to be conveyed on the basis of the image information from the fixed camera 12 (S101). Then, the integrated processor 28 transmits the operation command signal to the robot controller 30 on the basis of the position of the object 4. The robot controller 30 controls the operation of the robot arm apparatus 6 on the basis of the operation command signal from the integrated processor 28, to move the robot hand apparatus 8 to a position just above the upper surface of the object 4 (S102). At this time, the robot hand apparatus 8 is held in a posture in which the longitudinal directions of the first holder 40 and the second holder 42 are substantially parallel to the vertical direction (Z-axis direction).

Then, the integrated processor 28 judges a region 88 that can be sucked of an upper surface (an example of sucked surface) of the object 4 (hereinafter, referred to as "sucked region 88") on the basis of the image information from the tip camera 10 (S103), and determines the sucking positions of the first holder 40 and the second holder 42 in the sucked region 88 (S104). The integrated processor 28 transmits the operation command signal to the robot controller 30 on the basis of the determined sucking positions. The robot controller 30 controls the operation of the robot arm apparatus 6 on the basis of the operation command signal from the integrated processor 28. Thus, as illustrated in FIG. 8(a), the robot hand apparatus 8 is lowered, and the distal end 40b of the first holder 40 and the distal end 42b of the second holder 42 touch the sucked region 88 of the object 4 (S105).

The integrated processor 28 determines the position of the flexible portion 86 in each of the pair of first magnetic elastic bodies 50 (the pair of second magnetic elastic bodies 64) on the basis of the size of the sucked region 88 (S106), and transmits the energization control signal to the hand controller 32. The hand controller 32 energizes the first magnetic-field generator 54 and the second magnetic-field generator 68 of the robot hand apparatus 8 on the basis of the energization control signal from the integrated processor 28. Thus, the magnetic field from the first magnetic-field generator 54 is applied to the pair of first magnetic elastic bodies 50, and the magnetic field from the second magnetic-field generator 68 is applied to the pair of second magnetic elastic bodies 64 (S107). For example, as illustrated in FIG. 6B, when the coils 54e and 54g among the coils 54a to 54h are energized in the opposite directions, the flexible portion 86 is formed in the region between the coil 54e and the coil 54g in each of the pair of first magnetic elastic bodies 50 (the pair of second magnetic elastic bodies 64).

As illustrated in FIG. 8(b), the robot hand apparatus 8 is further lowered, and the distal end 40b of the first holder 40 and the distal end 42b of the second holder 42 are pressed to the sucked region 88 of the object 4 (S108). Thus, the first sucking surface 44 is bent at a first position 90 corresponding to the flexible portion 86, and the second sucking surface 46 is bent at a second position 92 corresponding to the flexible portion 86. Consequently, the distal end 40b of the first holder 40 and the distal end 42b of the second holder 42 move in a direction away from each other while sliding on the sucked region 88 of the object 4.

The distal end 40b of the first holder 40 and the distal end 42b of the second holder 42 are further pressed to the sucked region 88 of the object 4, and hence, as illustrated in FIG. 8(c), the first sucking surface 44 and the second sucking surface 46 are respectively bent at substantially right angle at the first position 90 and the second position 92. Thus, a region of the first sucking surface 44 between the first position 90 and the distal end 40b of the first holder 40 touches the sucked region 88, and a region of the second sucking surface 46 between the second position 92 and the distal end 42b of the second holder 42 touches the sucked region 88. Note that the positions of the flexible portions 86 are set such that the distal end 40b of the first holder 40 and the distal end 42b of the second holder 42 do not protrude from the ends of the sucked region 88.

The integrated processor 28 transmits the pressure control signal to the pressure regulating device 16 on the basis of the image information from the tip camera 10. With the signal, the vacuum pump 34 is driven in a state in which the valve 36 is closed, and air is sucked through the first sucking holes 58 of the first sucking surface 44 and the second sucking holes 72 of the second sucking surface 46. Consequently, the region of the first sucking surface 44 between the first position 90 and the distal end 40b of the first holder 40 sucks the sucked region 88 using negative pressure, and the region of the second sucking surface 46 between the second position 92 and the distal end 42b of the second holder 42 sucks the sucked region 88 using negative pressure (S109). In this way, the object 4 is held by the first holder 40 and the second holder 42, and is picked up from the palette 18.

At this time, a region of the first sucking surface 44 between the first position 90 and the proximal end 40a of the first holder 40, and a region of the second sucking surface 46 between the second position 92 and the proximal end 42a of the second holder 42 are in contact (close contact) with each other. Thus, all the first sucking holes 58 and the second sucking holes 72 are closed, and the object 4 can be stably vacuum sucked. Note that, in this case, the driving of the vacuum pump 34 may be stopped in the state in which the valve 36 is closed.

Then, the integrated processor 28 of the controller 14 judges the position of the conveyance destination (for example, storage shelf) of the object 4 on the basis of the image information from the fixed camera 12 (S110). Then, the integrated processor 28 transmits the operation command signal to the robot controller 30 on the basis of the position of the conveyance destination of the object 4. The robot controller 30 controls the operation of the robot arm apparatus 6 on the basis of the operation command signal from the integrated processor 28, to move the robot hand apparatus 8 to the conveyance destination in a state in which the object 4 is held by the first holder 40 and the second holder 42. Thus, the object 4 is conveyed to the conveyance destination (S111).

In this case, the integrated processor 28 judges a region that can store the object 4 (hereinafter, referred to as "storage region") at the conveyance destination on the basis of the image information from the tip camera 10. The integrated processor 28 transmits the pressure control signal to the pressure regulating device 16 when the integrated processor 28 judges that the object 4 has been stored in the storage region on the basis of the image information from the tip camera 10. Thus, the driving of the vacuum pump 34 is stopped, the valve 36 is opened, and the sucking of the object 4 to the first sucking surface 44 and the second sucking surface 46 is released (S112).

The integrated processor 28 transmits the energization control signal to the hand controller 32 on the basis of the image information from the tip camera 10. The hand controller 32 stops the energization of the first magnetic-field generator 54 and the second magnetic-field generator 68 of the robot hand apparatus 8 on the basis of the energization control signal from the integrated processor 28. Thus, the application of the magnetic field to each of the pair of first magnetic elastic bodies 50 and the pair of second magnetic elastic bodies 64 is stopped (S113).

The first sucking surface 44 and the second sucking surface 46 are restored from the state bent at the first position 90 and the second position 92 (the state illustrated in FIG. 8(c)) to the original straight state (the state illustrated in FIG. 8(a)) due to the elastic restoring force of the first elastic member 48 and the second elastic member 62.

1-4. Advantages

As described above, by forming the flexible portions 86 in the pair of first magnetic elastic bodies 50 and the pair of second magnetic elastic bodies 64, the first sucking surface 44 and the second sucking surface 46 can be easily respectively bent at the first position 90 and the second position 92 corresponding to the flexible portions 86. By adjusting the first position 90 and the second position 92 at which the first sucking surface 44 and the second sucking surface 46 are respectively bent in accordance with the size of the object 4, the sizes of the regions of the first sucking surface 44 and the second sucking surface 46 that suck the object 4 can be adjusted. Thus, the distal end 40b of the first holder 40 and the distal end 42b of the second holder 42 can be prevented from protruding from the ends of the sucked region 88 of the object 4. For example, a target object 4 can be correctly picked up from among densely arranged products 20.

1-5. Use Example

Figure 9A:
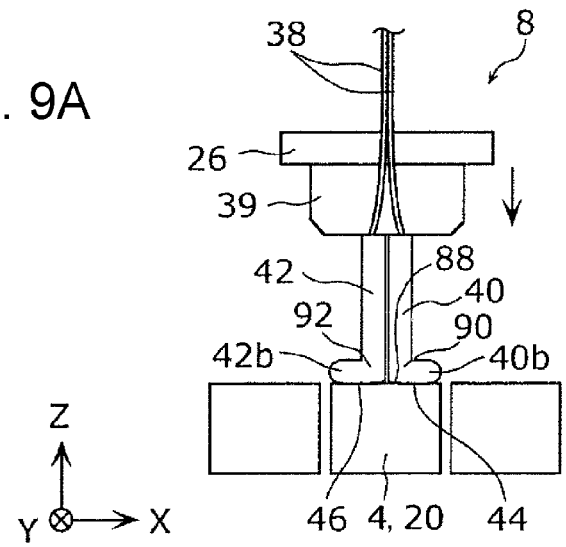
FIG. 9A illustrates use example 1 of the robot hand system according to the first embodiment.
Figure 9B:
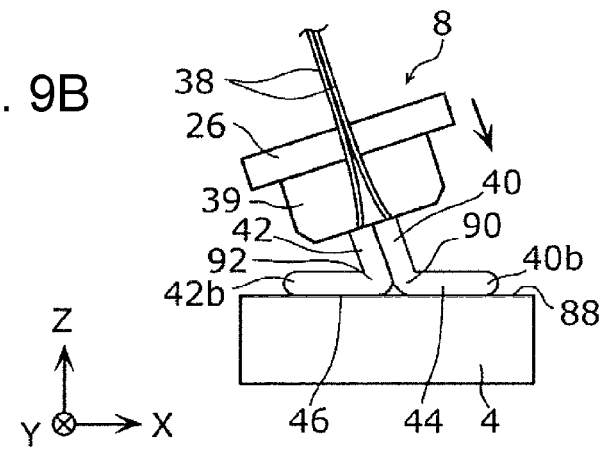
FIG. 9B illustrates use example 2 of the robot hand system according to the first embodiment.
Figure 9C:
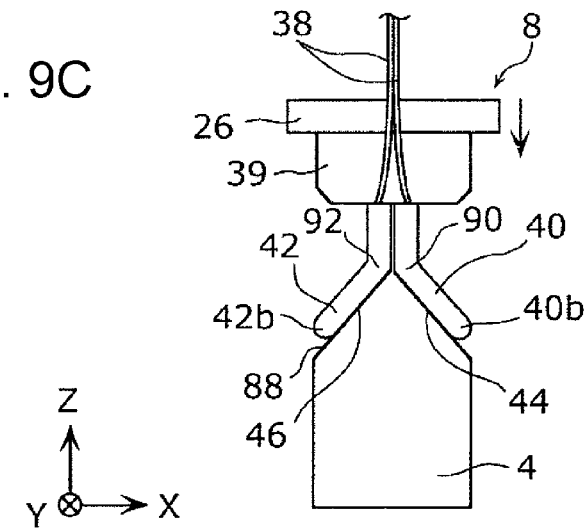
FIG. 9C illustrates use example 3 of the robot hand system according to the first embodiment.

Use examples of the robot hand system 2 according to the first embodiment are described next with reference to FIGS. 9A to 9C. FIG. 9A illustrates use example 1 of the robot hand system 2 according to the first embodiment. FIG. 9B illustrates use example 2 of the robot hand system 2 according to the first embodiment. FIG. 9C illustrates use example 3 of the robot hand system 2 according to the first embodiment.

As illustrated in FIG. 9A, in use example 1, products 20 with relatively small sizes are densely arranged. In this case, the first sucking surface 44 is bent at a first position 90 near the distal end 40b of the first holder 40, and the second sucking surface 46 is bent at a second position 92 near the distal end 42b of the second holder 42. Thus, since the distal end 40b of the first holder 40 and the distal end 42b of the second holder 42 can be prevented from protruding from ends of a sucked region 88 of an object 4, the target object 4 can be correctly picked up from among the products 20.

As illustrated in FIG. 9B, in use example 2, the posture of the robot hand apparatus 8 is tilted with respect to a sucked region 88 of an object 4. In this case, since the angles at which the first sucking surface 44 and the second sucking surface 46 are bent can be desirably adjusted, the object 4 can be reliably sucked to the first sucking surface 44 and the second sucking surface 46. Thus, for example, even when the posture of the robot hand apparatus 8 cannot be freely changed in a narrow space, such as the inside of a storage shelf or the inside of a package box, an object 4 can be reliably sucked.

As illustrated in FIG. 9C, in use example 3, the upper surface of an object 4 is not flat but has a mountain-like shape having two nonparallel surfaces. In this case, since the angles at which the first sucking surface 44 and the second sucking surface 46 are bent can be desirably adjusted, the object 4 can be reliably sucked to the first sucking surface 44 and the second sucking surface 46. As described above, even when the first sucking surface 44 and the second sucking surface 46 are tilted with respect to the vertical direction (Z-axis direction), an object 4 can be reliably sucked. This configuration is particularly useful, for example, when the portion that can suck an object 4 is limited because of an obstacle or the like.

Second Embodiment 2-1. Configuration of Robot Hand Apparatus

A robot hand apparatus 8A according to a second embodiment is described next with reference to FIGS. 10 to 11B. FIG. 10 illustrates a first holder 40A (second holder 42A) of the robot hand apparatus 8A according to the second embodiment. FIG. 11A illustrates the first holder 40A according to the second embodiment in a state in which the first holder 40A is entirely hardened. FIG. 11B illustrates the first holder 40A according to the second embodiment in a state in which the first holder 40A is partly hardened. In any of the embodiments described below, the same reference signs are applied to the same components as those of the first embodiment, and the redundant description thereof is omitted.

As illustrated in FIG. 10, in the robot hand apparatus 8A according to the second embodiment, the configurations of a first magnetic-field generator 54A of the first holder 40A and a second magnetic-field generator 68A of the second holder 42A differ from those of the first embodiment.

Specifically, the first magnetic-field generator 54A has a permanent magnet 94 instead of the coil 54h described in the first embodiment. That is, the first magnetic-field generator 54A has the coils 54a to 54g, and the permanent magnet 94. The permanent magnet 94 is arranged to oppose the coils 54a to 54g in the longitudinal direction of the first holder 40A. The permanent magnet 94 is arranged, for example, such that the N-pole opposes the coils 54a to 54g.

Operation of entirely or partly hardening the first holder 40A by changing the coefficient of elasticity of the first magnetic elastic body 50 is described with reference to FIGS. 11A and 11B. For the convenience of description, FIG. 11A does not illustrate the coils 54a to 54g, and FIG. 11B illustrates the energized coil 54e among the coils 54a to 54g.

In the state illustrated in FIG. 11A, non of the coils 54a to 54g is energized by the hand controller 32 (see FIG. 1). Thus, the permanent magnet 94 generates a magnetic field. The magnetic field from the permanent magnet 94 almost does not leak to the atmosphere, and is concentrated on the first yoke 52 and the pair of first magnetic elastic bodies 50. Consequently, as shown by broken-line arrows in FIG. 11A, one magnetic circuit 96 is formed. In the magnetic circuit 96, the magnetic field from the permanent magnet 94 passes through the iron core 52a and the connection portion 52b of the first yoke 52, the pair of first magnetic elastic bodies 50, the connection portion 52c, and the iron core 52a in that order, and then returns to the permanent magnet 94. Thus, the magnetic field from the permanent magnet 94 is applied to the pair of magnetic elastic bodies 50.

As illustrated in FIG. 11A, the magnetic field from the permanent magnet 94 passes through each of the pair of first magnetic elastic bodies 50 from one end to the other end in the longitudinal direction thereof, and the coefficient of elasticity of each of the pair of magnetic elastic bodies 50 entirely increases. Consequently, a hardened portion 80 is formed in the entire region of each of the pair of magnetic elastic bodies 50, and the first holder 40A is entirely hardened.

In contrast, in the state illustrated in FIG. 11B, one specific coil, for example, the coil 54e among the coils 54a to 54g is energized by the hand controller 32. In this case, the coil 54e and the permanent magnet 94 generate magnetic fields such that the same magnetic poles (for example, N-poles) oppose each other. The magnetic fields generated from the coil 54e and the permanent magnet 94 repel each other and leak to the atmosphere, immediately after generated. The magnetic fields leaking to the atmosphere are concentrated on the pair of first magnetic elastic bodies 50 with high magnetic permeability.

Consequently, as shown by broken-line arrows in FIG. 11B, two magnetic circuits 98 and 100 are formed. In the one magnetic circuit 98, the magnetic field from the coil 54e passes through the iron core 52a of the first yoke 52, the pair of first magnetic elastic bodies 50, the connection portion 52b, and the iron core 52a in that order, and then returns to the coil 54e. Thus, the magnetic field from the coil 54e is applied to the pair of magnetic elastic bodies 50 in the magnetic circuit 98. In the other magnetic circuit 100, the magnetic field from the permanent magnet 94 passes through the iron core 52a of the first yoke 52, the pair of first magnetic elastic bodies 50, the connection portion 52c, and the iron core 52a in that order, and then returns to the permanent magnet 94. Thus, the magnetic field from the permanent magnet 94 is applied to the pair of magnetic elastic bodies 50 in the magnetic circuit 100.

As illustrated in FIG. 11B, the magnetic field from the coil 54e passes through a region of each of the pair of first magnetic elastic bodies 50 on the side near the proximal end 40a of the first holder 40A with respect to the coil 54e. In contrast, the magnetic field from the permanent magnet 94 passes through a region of each of the pair of first magnetic elastic bodies 50 on the side near the distal end 40b of the first holder 40A with respect to the permanent magnet 94. Thus, the coefficient of elasticity in the region where the magnetic field passes of the pair of first magnetic elastic bodies 50 is relatively big, and the coefficient of elasticity in a region where the magnetic field does not pass (that is, a region between the coil 54e and the permanent magnet 94) is relatively small. Consequently, in each of the pair of magnetic elastic bodies 50, a flexible portion 86 is formed in the region between the coil 54e and the permanent magnet 94, and a hardened portion 80 with a bigger coefficient of elasticity than that of the flexible portion 86 is formed in the region other than the flexible portion 86. That is, the first holder 40A is partly hardened.

Hence, the first sucking surface 44 (see FIG. 3) of the first holder 40A can be easily bent at a position corresponding to the flexible portion 86 in the longitudinal direction of the first holder 40A, similarly to the first embodiment. Note that the position of the flexible portion 86 can be appropriately changed by desirably selecting one specific coil to be energized from among the coils 54a to 54g. Operation of entirely or partly hardening the second holder 42A is similar to the above-described operation and hence its description is omitted.

2-2. Advantages

Advantages similar to those of the first embodiment can be obtained in this embodiment. When the flexible portion 86 is formed in each of the pair of first magnetic elastic bodies 50, one specific coil of the coils 54a to 54g is energized, and hence the power consumption can be reduced.

In the first and second embodiments, the position of the flexible portion 86 is adjusted by selecting the coil to be energized; however, the position of the flexible portion 86 may be adjusted in accordance with the amount of current to be applied to a coil. For example, a magnetic-field generator is arranged at each of the distal end 40b and the proximal end 40a of the first holder 40 (40A) and magnetic fields are generated such that the same magnetic poles oppose each other. In this case, the position at which the flexible portion 86 is formed can be adjusted by adjusting the strength of the magnetic field generated at the proximal end 40a (and the distal end 40b) of the first holder 40 (40A).

Third Embodiment 3-1. Configuration of Robot Hand Apparatus

Figure 12:
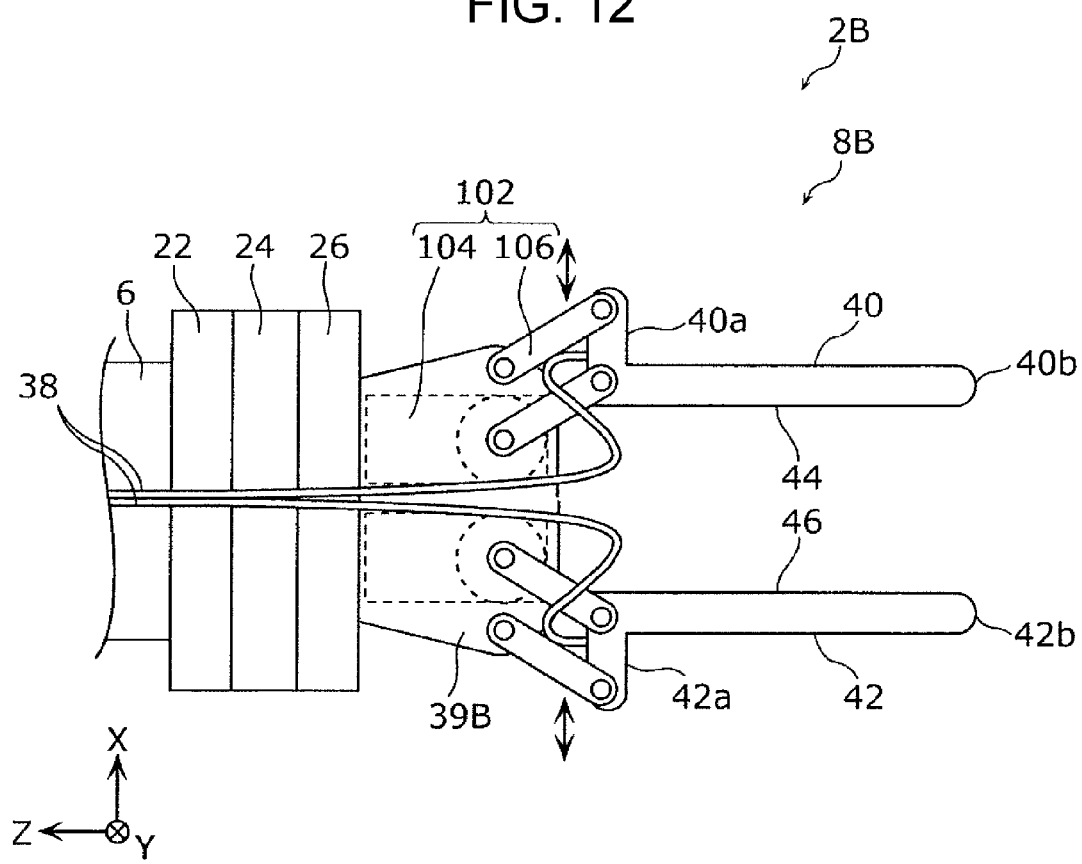
FIG. 12 illustrates a robot hand apparatus according to a third embodiment.

A robot hand apparatus 8B according to a third embodiment is described next with reference to FIG. 12. FIG. 12 illustrates the robot hand apparatus 8B according to the third embodiment.

As illustrated in FIG. 12, in a robot hand system 2B according to the third embodiment, the configuration of the robot hand apparatus 8B differs from that of the first embodiment. Specifically, the robot hand apparatus 8B has a driving mechanism 102 that changes the distance between the first holder 40 and the second holder 42.

The driving mechanism 102 is supported by a hand supporter 39B. The driving mechanism 102 has a rotary actuator 104 and a parallel linkage 106. The rotary actuator 104 drives the parallel linkage 106 on the basis of the driving signal from the hand controller 32 (see FIG. 1). When the parallel linkage 106 is driven by the rotary actuator 104, the parallel linkage 106 translates the first holder 40 and the second holder 42 in a direction (X-axis direction) toward or away from each other. Thus, the distance between the first holder 40 and the second holder 42 can be decreased or increased.

The proximal end 40a of the first holder 40 and the proximal end 42a of the second holder 42 are supported by the hand supporter 39B via the parallel linkage 106.

In this embodiment, the vacuum pump 34 (see FIG. 1) is formed of a blower-type vacuum pump (vacuum blower) that can suck an object with high flow rate even when air is leaking. That is, the object 4 can be sucked even when not all the first sucking holes 58 and the second sucking holes 72 (see FIG. 4A) are closed.

3-2. Operation of Robot Hand System

Figure 13:
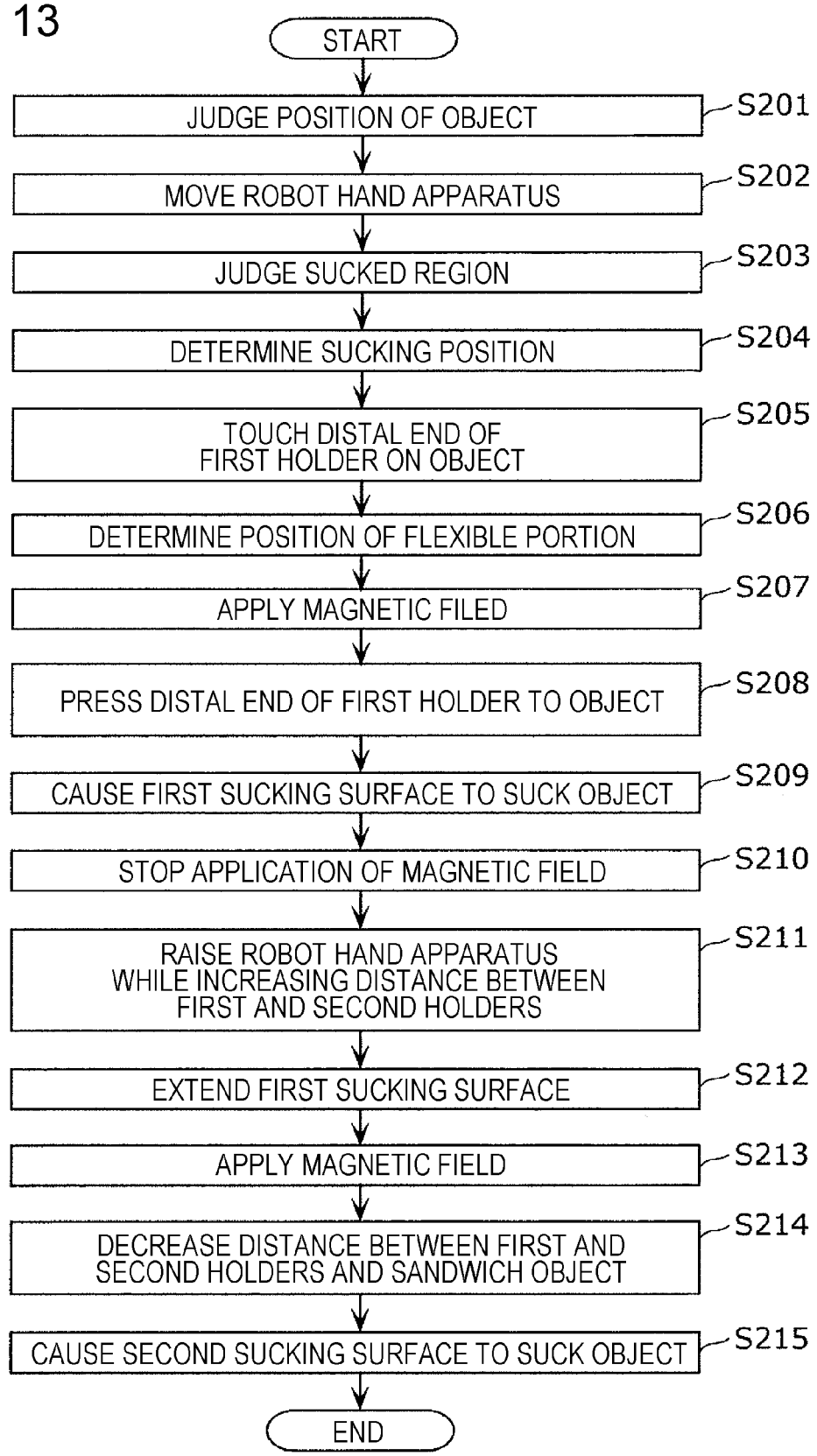
FIG. 13 is a flowchart showing a flow of operation of picking up an object by a robot hand system according to the third embodiment.
Figure 14:
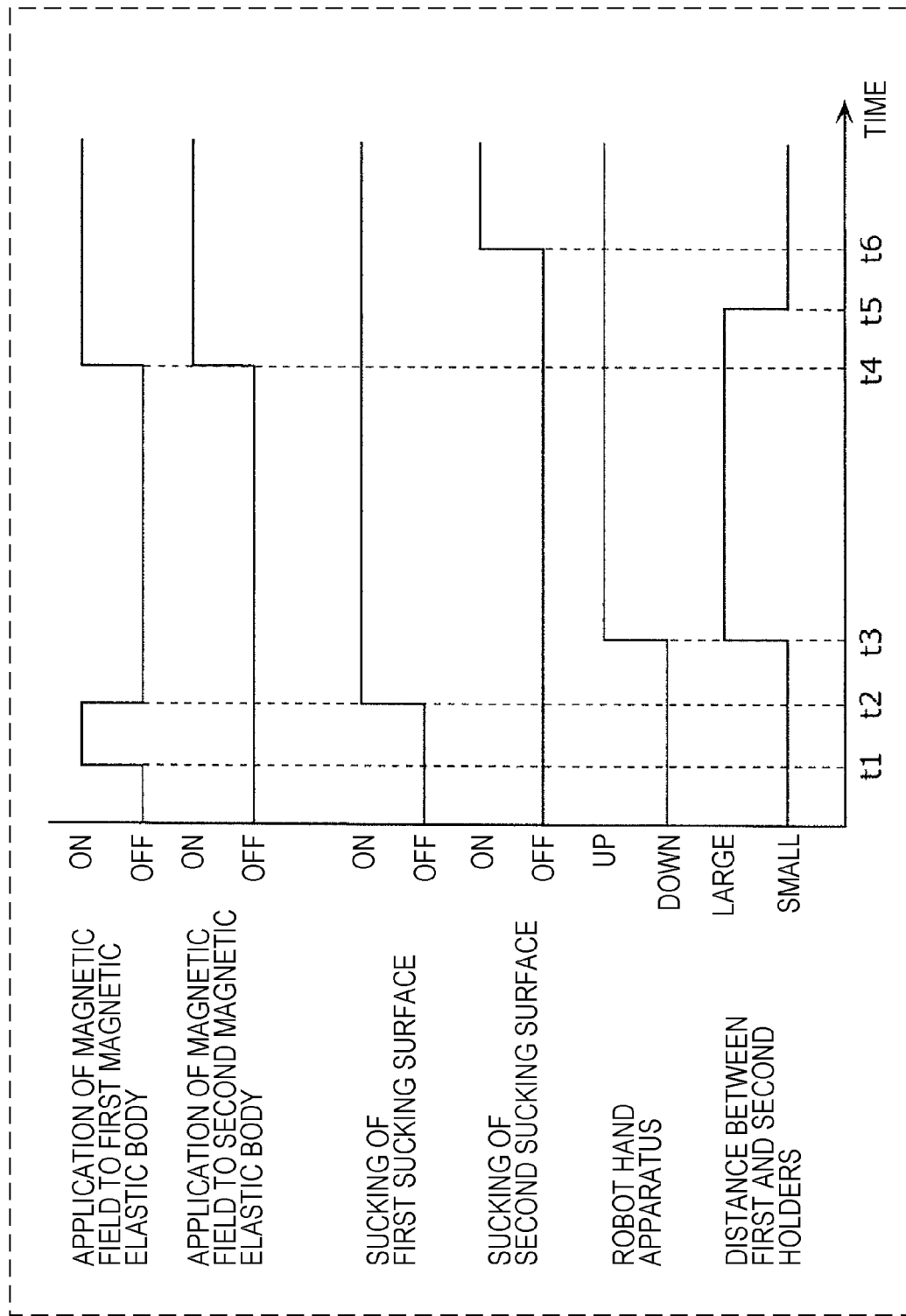
FIG. 14 is a timing chart showing the flow of the operation of picking up the object by the robot hand system according to the third embodiment.
Figure 15:
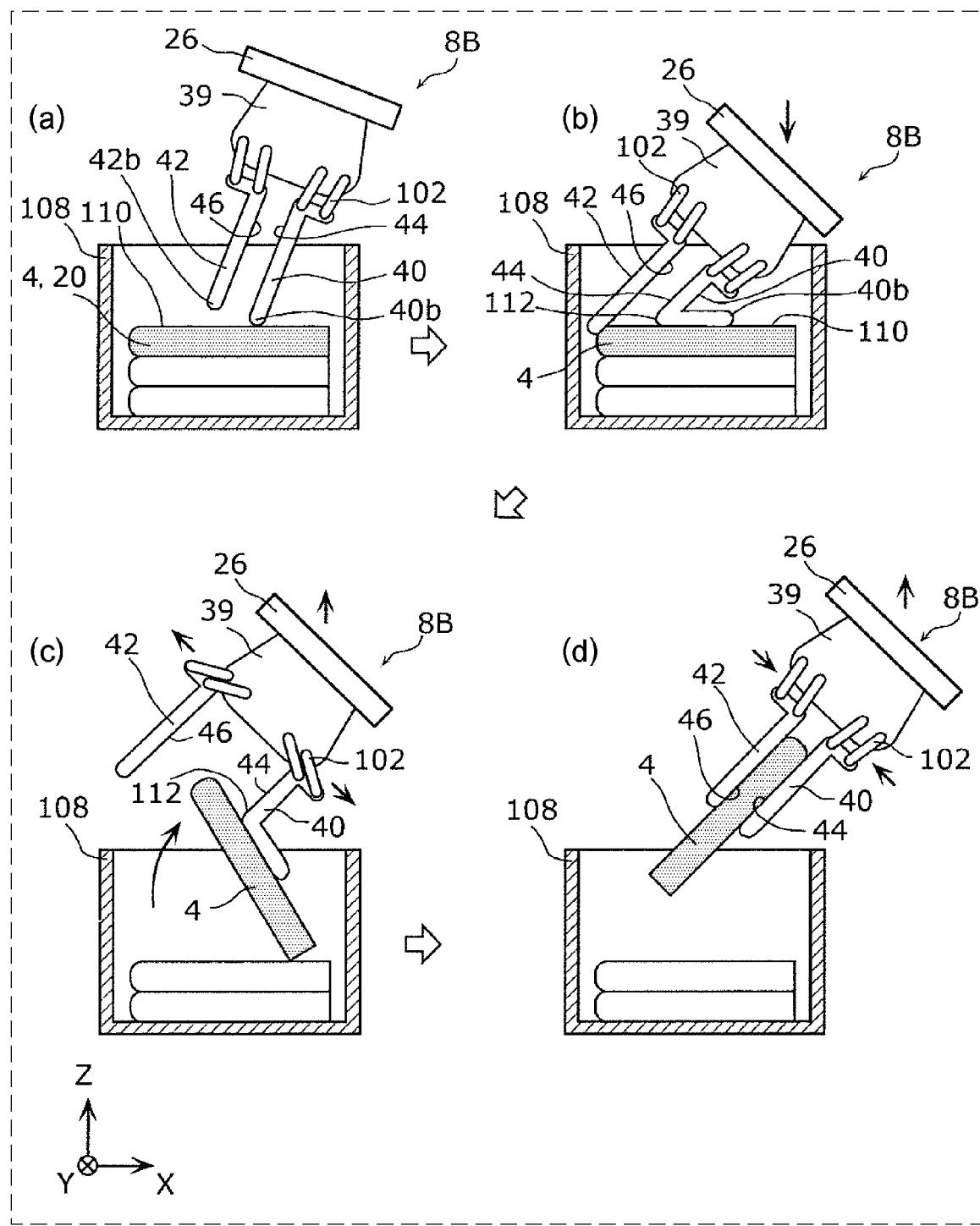
FIG. 15 illustrates the flow of the operation of picking up the object by the robot hand system according to the third embodiment.

Operation of picking up the object 4 by the robot hand system 2B according to the third embodiment is described next with reference to FIGS. 13 to 15. FIG. 13 is a flowchart showing a flow of the operation of picking up the object 4 by the robot hand system 2B according to the third embodiment. FIG. 14 is a timing chart showing the flow of the operation of picking up the object 4 by the robot hand system 2B according to the third embodiment. FIG. 15 illustrates the flow of the operation of picking up the object 4 by the robot hand system 2B according to the third embodiment.

As illustrated in FIG. 15(a), products 20 are stored in a package box 108 arranged in, for example, a warehouse of a store, in a stacked manner in the up-down direction (Z-axis direction). The object 4 is a product 20 which is a target to be picked up by the robot hand system 2B from among the products 20, and is, for example, a product 20 which is arranged on the top.

As illustrated in FIG. 13, steps S201 to S204 are executed similarly to steps S101 to S104 described in the first embodiment. In step S202, as illustrated in FIG. 15(a), the robot hand apparatus 8B is in a posture in which the longitudinal directions of the first holder 40 and the second holder 42 are tilted with respect to the vertical direction (Z-axis direction).

Then, as illustrated in FIG. 15(a), the robot hand apparatus 8B is lowered, and the distal end 40b of the first holder 40 touches a sucked region 110 of the upper surface (an example of sucked surface) of the object 4 (S205). Then, the integrated processor 28 of the controller 14 (see FIG. 1) determines the position of the flexible portion 86 (see FIG. 6B) in each of the pair of first magnetic elastic bodies 50 (see FIG. 4C) on the basis of the size of the sucked region 110 (S206), and transmits the energization control signal to the hand controller 32. The hand controller 32 energizes the first magnetic-field generator 54 (see FIG. 4C) of the robot hand apparatus 8B on the basis of the energization control signal from the integrated processor 28. Thus, at time t1 in FIG. 14, the magnetic field from the first magnetic-field generator 54 is applied to the pair of first magnetic elastic bodies 50 (S207), and the flexible portion 86 is formed in each of the pair of first magnetic elastic bodies 50. That is, the first holder 40 is partly hardened.

As illustrated in FIG. 15(b), the robot hand apparatus 8B is further lowered, and the distal end 40b of the first holder 40 is pressed to the sucked region 110 of the object 4 (S208). With the pressing, the first sucking surface 44 is bent at a first position 112 corresponding to the flexible portion 86. Thus, a region of the first sucking surface 44 between the first position 112 and the distal end 40b of the first holder 40 touches the sucked region 110.

At this time, the second holder 42 is moved to a position so as not to interfere with the operation of the robot hand apparatus 8B. If the distal end 42b of the second holder 42 interferes with an inner wall surface or the like of the package box 108, the second holder 42 may be bent by pressing a side surface of the second holder 42 on the side opposite to the second sucking surface 46, to the inner wall surface or the like of the package box 108.

The integrated processor 28 transmits the pressure control signal to the pressure regulating device 16 (see FIG. 1) on the basis of the image information from the tip camera 10 (see FIG. 1). With the signal, the vacuum pump 34 is driven in the state in which the valve 36 is closed, and air of the first space 56 (see FIG. 4B) of the first holder 40 is sucked with high flow rate. Consequently, the sucked region 110 is sucked to a region of the first sucking surface 44 between the first position 112 and the distal end 40b of the first holder 40 using negative pressure at time t2 in FIG. 14 (S209).

The hand controller 32 stops the energization of the first magnetic-field generator 54 of the robot hand apparatus 8B on the basis of the energization control signal from the integrated processor 28. Thus, the application of the magnetic field to each of the pair of first magnetic elastic bodies 50 is stopped at time t2 in FIG. 14 (S210).

Then, the integrated processor 28 transmits the driving signal to the robot hand apparatus 8B, and transmits the operation command signal to the robot controller 30. With the signals, as illustrated in FIG. 15(c), the distance between the first holder 40 and the second holder 42 starts increasing, and the robot hand apparatus 8B starts rising at time t3 in FIG. 14 (S211). Consequently, the first sucking surface 44 bent at the first position 112 extends straight due to the elastic restoring force of the first elastic member 48 (see FIG. 4A) in the state in which the object 4 is sucked to the first sucking surface 44 of the first holder 40 (S212). At this time, the region of the first sucking surface 44 between the first position 112 and the distal end 40b of the first holder 40 is vertically inverted, and hence the object 4 can be vertically inverted.

Then, the hand controller 32 energizes the first magnetic-field generator 54 and the second magnetic-field generator 68 (see FIG. 4C) of the robot hand apparatus 8B on the basis of the energization control signal from the integrated processor 28. Thus, the magnetic field from the first magnetic-field generator 54 is applied to the pair of first magnetic elastic bodies 50, and the magnetic field from the second magnetic-field generator 68 is applied to the pair of second magnetic elastic bodies 64 at time t4 in FIG. 14 (S213). That is, the first holder 40 and the second holder 42 are entirely hardened.

Thereafter, the integrated processor 28 transmits the driving signal to the hand controller 32. Thus, as illustrated in FIG. 15(d), the distance between the first holder 40 and the second holder 42 starts decreasing, and the object 4 is sandwiched between the first holder 40 and the second holder 42 at time t5 in FIG. 14 (S214). At this time, the robot hand apparatus 8B is continuously rising.

Then, the integrated processor 28 transmits the pressure control signal to the pressure regulating device 16 on the basis of the image information from the tip camera 10. Thus, the vacuum pump 34 is driven in the state in which the valve 36 is closed, and air of the second space 70 (see FIG. 4B) of the second holder 42 is sucked with high flow rate. Consequently, the object 4 is sucked to the second sucking surface 46 of the second holder 42 using negative pressure at time t6 in FIG. 14 (S215).

The object 4 is picked up from the package box 108 by the robot hand system 2B in this way.

3-3. Advantages

In this embodiment, the object 4 can be sucked to the first sucking surface 44 using negative pressure and picked up in the state in which the first sucking surface 44 is bent at any position. Thus, for example, even when the object 4 is arranged in a narrow space such as the inside of the package box 108, the object 4 can be easily picked up by appropriately bending the first sucking surface 44 in accordance with the size or shape of the space, while the robot hand apparatus 8B is prevented from interfering with the package box 108 or the like. Furthermore, since the distance between the first holder 40 and the second holder 42 is decreased by the driving mechanism 102 in the state in which the object 4 is sucked to the first sucking surface 44, the object 4 can be sandwiched between the first holder 40 and the second holder 42. Thus, for example, the object 4 can be conveyed while the object 4 is reliably held.

Other Modifications

While the robot hand apparatus according to one or multiple aspects has been described above with reference to the first to third embodiments, the present disclosure is not limited to the first to third embodiments. Embodiments modified in various ways conceivable by those skilled in the art and an embodiment constructed by combining components in different embodiments may be included within the scope of one or multiple aspects as long as the embodiments are not departing from the spirit of the present disclosure.

While the robot hand apparatus includes the two holders in any of the above-described embodiments, it is not limited thereto, and the robot hand apparatus may include one, or three or more holders.

In any of the above-described embodiments, each component may be formed of dedicated hardware or may be provided by executing a software program suitable for the component. Each component may be provided by a program executing unit, such as a central processing unit (CPU) or a processor, reading a software program stored in a storage medium, such as a hard disk or a semiconductor memory.

The components constituting each of the above-described apparatuses and devices may be partly or entirely formed of an integrated circuit (IC) card or a single module that is removably attached to the apparatus or device. The IC card or the module is a computer system formed of a microprocessor, a read-only memory (ROM), a random-access memory (RAM), or the like. The IC card or the module may include a super multi-functional large scale integrated (LSI) circuit. The microprocessor operates in accordance with the computer program and thus the IC card or the module provides the function. The IC card or the module may be tamper resistant.

The present disclosure may be a method as one described above. The method may be provided by a computer program executed by a computer, or may be a digital signal composed of the computer program. The present disclosure may be a computer-readable storage medium storing the computer program or the digital signal. The storage medium is, for example, a flexible disk, a hard disk, a CD-ROM, a magneto-optical (MO) disk, a digital versatile disk (DVD), a DVD-ROM, a DVD-RAM, Blu-ray (BD) Disc (registered trademark), or a semiconductor memory. The present disclosure may be the digital signal stored in such a storage medium. According to the present disclosure, the computer program or the digital signal may be transmitted via an electric communication line, a wireless or wired communication line, a network typically represented by the Internet, or data broadcasting. The present disclosure may be a computer system including a microprocessor and a memory, the memory may store the computer program, and the microprocessor may be operated in accordance with the computer program. The present disclosure may be implemented by another independent computer system by storing the program or the digital signal in the non-transitory computer-readable storage medium and transferring the storage medium, or by transferring the program or the digital signal via the network or the like.

The robot hand apparatus according to the present disclosure is useful for a robot hand system that picks up, for example, a product in a warehouse of a store.

What is claimed is:

1. A robot hand apparatus, comprising:
   a supporter;
   a holder with a proximal end thereof supported by the supporter, the holder having a sucking surface that is configured to be bent and that sucks an object using negative pressure;
   a magnetic elastic body arranged at the holder and formed of an elastic material containing magnetic particles; and
   a magnetic-field generator that is arranged at the holder and that applies a magnetic field to the magnetic elastic body to change a coefficient of elasticity of the magnetic elastic body,
   wherein, when the magnetic-field generator applies a magnetic field to the magnetic elastic body, a flexible portion and a hardened portion having a bigger coefficient of elasticity than a coefficient of elasticity of the flexible portion are formed in the magnetic elastic body, and
   wherein, when the holder holds the object, in a state in which the sucking surface is bent at a position corresponding to the flexible portion, a surface region of the sucking surface between the position and a distal end of the holder sucks the object.

2. The robot hand apparatus according to claim 1, wherein the distal end of the holder is pressed to the object, and thus the sucking surface is bent at the position.

3. The robot hand apparatus according to claim 1, wherein the holder extends long from the proximal end to the distal end, and
   wherein the magnetic-field generator is coils that are lined in a longitudinal direction of the holder, that are individually energized, and thus that individually apply magnetic fields to the magnetic elastic body.

4. The robot hand apparatus according to claim 3, wherein, when two specific coils of the coils are energized, the two specific coils generate magnetic fields in which same magnetic poles oppose each other, and
   wherein the flexible portion is formed in the magnetic elastic body between the two specific coils.

5. The robot hand apparatus according to claim 3, wherein the magnetic-field generator further has a permanent magnet that applies a magnetic field to the magnetic elastic body, wherein the permanent magnet is arranged to oppose the coils in the longitudinal direction of the holder, wherein, when a specific coil of the coils is energized, the specific coil and the permanent magnet generate magnetic fields in which same magnetic poles oppose each other, and wherein the flexible portion is formed in the magnetic elastic body between the specific coil and the permanent magnet.

6. The robot hand apparatus according to claim 1, wherein the sucking surface has a sucking hole through which air is sucked, and wherein, when air is sucked through the sucking hole, the sucking surface sucks the object using negative pressure.

7. The robot hand apparatus according to claim 1, wherein the holder includes a pair of holders, and wherein the pair of holders are arranged such that sucking surfaces of the pair of holders oppose each other.

8. A robot hand system, comprising:

the robot hand apparatus according to claim 1;

a robot arm apparatus that supports the robot hand apparatus and that changes a position or a posture of the robot hand apparatus;

a pressure regulating device that sucks air from the holder of the robot hand apparatus; and a controller that controls the robot hand apparatus, the robot arm apparatus, and the pressure regulating device so that the robot hand apparatus holds the object.

9. The robot hand system according to claim 8, further comprising:

an imaging device that image captures the object, wherein the controller judges a sucked region that can be sucked of a sucked surface of the object on the basis of a result of the image capture by the imaging device, and determines a position of the flexible portion to be formed in the magnetic elastic body, and thus, in a state in which the sucking surface is bent at a position corresponding to the flexible portion, a surface region of the sucking surface between the position and the distal end of the holder sucks the object so as not to protrude from the sucked region.

10. A holding method using a robot hand apparatus, the robot hand apparatus including a supporter, a holder with a proximal end thereof supported by the supporter, the holder having a sucking surface that is bendable at any position and that sucks an object using negative pressure, a magnetic elastic body arranged at the holder and formed of an elastic material containing magnetic particles, and a magnetic-field generator that is arranged at the holder and that applies a magnetic field to the magnetic elastic body to change a coefficient of elasticity of the magnetic elastic body, the method comprising:

applying a magnetic field to the magnetic elastic body, and thus forming a flexible portion and a hardened portion having a bigger coefficient of elasticity than a coefficient of elasticity of the flexible portion in the magnetic elastic body;

pressing a distal end of the holder to the object, and thus bending the sucking surface at a position corresponding to the flexible portion; and causing a surface region of the sucking surface between the position and the distal end of the holder to suck the object.

11. The holding method according to claim 10, further comprising:

image capturing the object using an imaging device;

judging a sucked region that is included in a sucked surface of the object and that can be sucked to the sucking surface of the holder on the basis of a result of the image capture by the imaging device; and determining a position of the flexible portion to be formed in the magnetic elastic body on the basis of a size of the sucked region.

\* \* \* \* \*